(12) United States Patent
Hirano et al.

(10) Patent No.: US 7,482,658 B2
(45) Date of Patent: *Jan. 27, 2009

(54) SEMICONDUCTOR DEVICE AND METHOD OF MANUFACTURING THE SAME

(75) Inventors: Yuuichi Hirano, Tokyo (JP); Shigeto Maegawa, Tokyo (JP); Toshiaki Iwamatsu, Tokyo (JP); Takuji Matsumoto, Tokyo (JP); Shigenobu Maeda, Tokyo (JP); Yasuo Yamaguchi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/677,951

(22) Filed: Feb. 22, 2007

(65) Prior Publication Data

US 2007/0132028 A1    Jun. 14, 2007

Related U.S. Application Data

(62) Division of application No. 11/108,843, filed on Apr. 19, 2005, now Pat. No. 7,193,272, which is a division of application No. 09/802,886, filed on Mar. 12, 2001, now abandoned.

(30) Foreign Application Priority Data

Mar. 22, 2000   (JP)   .............................. 2000-080096
Nov. 10, 2000   (JP)   .............................. 2000-342937

(51) Int. Cl.
    *H01L 21/00* (2006.01)
(52) U.S. Cl. ...................................................... 257/351

(58) Field of Classification Search .......... 257/347–351
See application file for complete search history.

(56) References Cited

U.S. PATENT DOCUMENTS

| 5,747,846 | A   | 5/1998 | Iida et al. |
| 6,118,152 | A   | 9/2000 | Yamaguchi et al. |
| 6,121,659 | A   | 9/2000 | Christensen et al. |
| 7,193,272 | B2* | 3/2007 | Hirano et al. ............... 257/347 |

FOREIGN PATENT DOCUMENTS

JP          5-251647          9/1993

OTHER PUBLICATIONS

U.S. Appl. No. 11/677,951, filed Feb. 22, 2007, Hirano, et al.
U.S. Appl. No. 11/677,956, filed Feb. 22, 2007, Hirano, et al.

* cited by examiner

*Primary Examiner*—Richard A. Booth
(74) *Attorney, Agent, or Firm*—Oblon, Spivak, McClelland, Maier & Neustadt, P.C.

(57) ABSTRACT

An isolation insulating film (5) of partial-trench type is selectively formed in an upper surface of a silicon layer (4). A power supply line (21) is formed above the isolation insulating film (5). Below the power supply line (21), a complete isolation portion (23) reaching an upper surface of an insulating film (3) is formed in the isolation insulating film (5). In other words, a semiconductor device comprises a complete-isolation insulating film which is so formed as to extend from the upper surface of the silicon layer (4) and reach the upper surface of insulating film (3) below the power supply line (21). With this structure, it is possible to obtain the semiconductor device capable of suppressing variation in potential of a body region caused by variation in potential of the power supply line.

4 Claims, 25 Drawing Sheets

F I G. 1
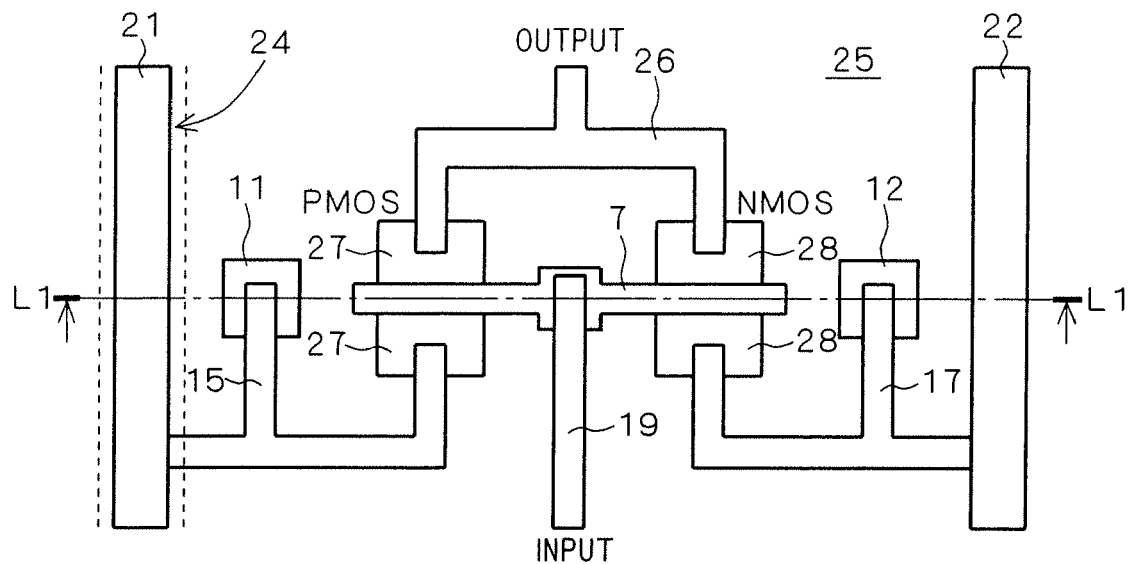
F I G. 2
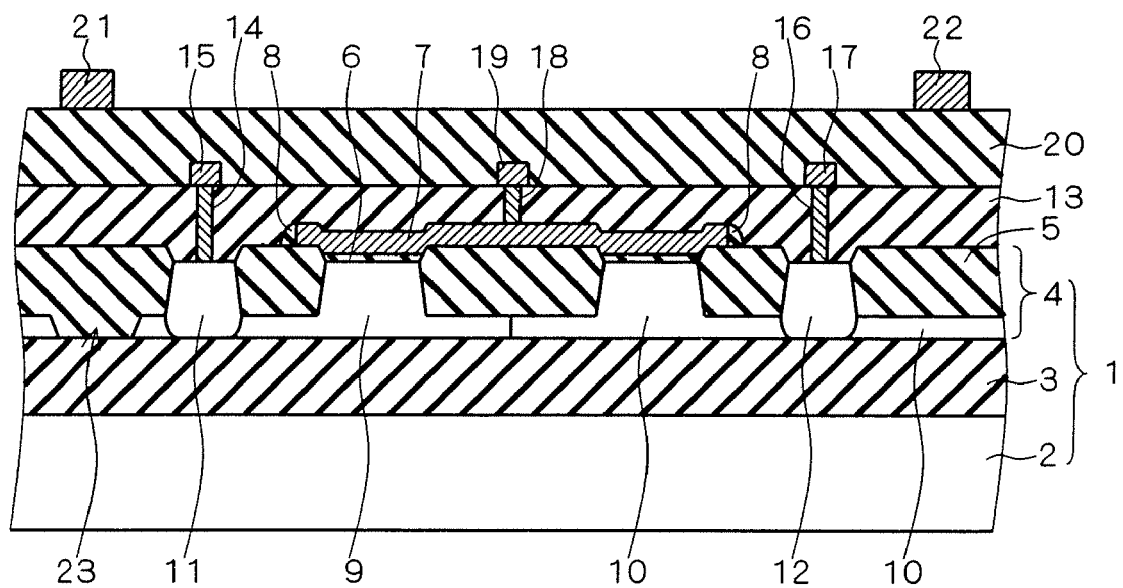

F I G. 3
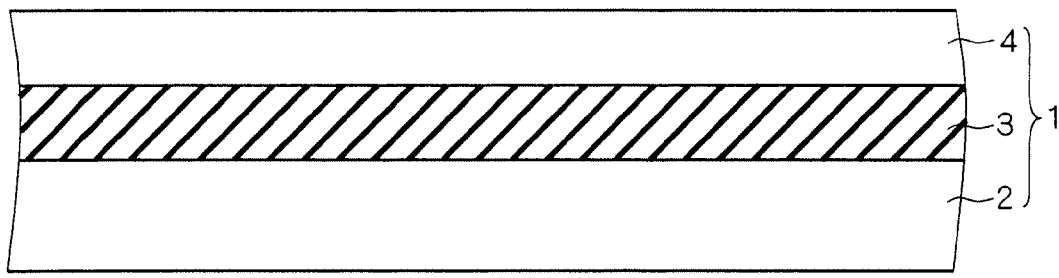
F I G. 4
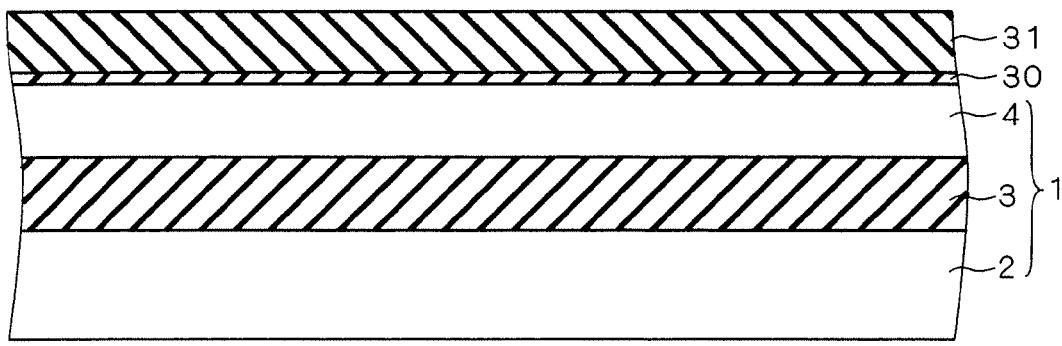
F I G. 5
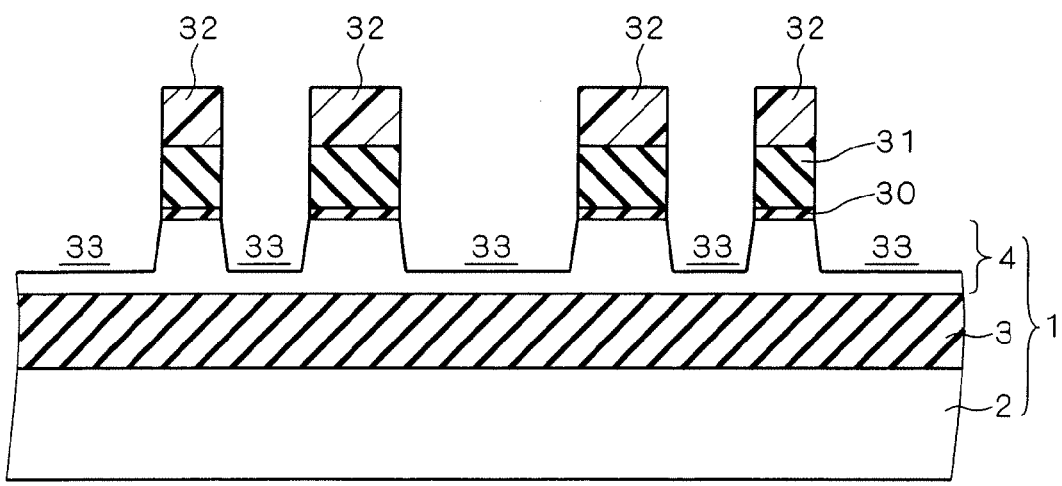

F I G. 16
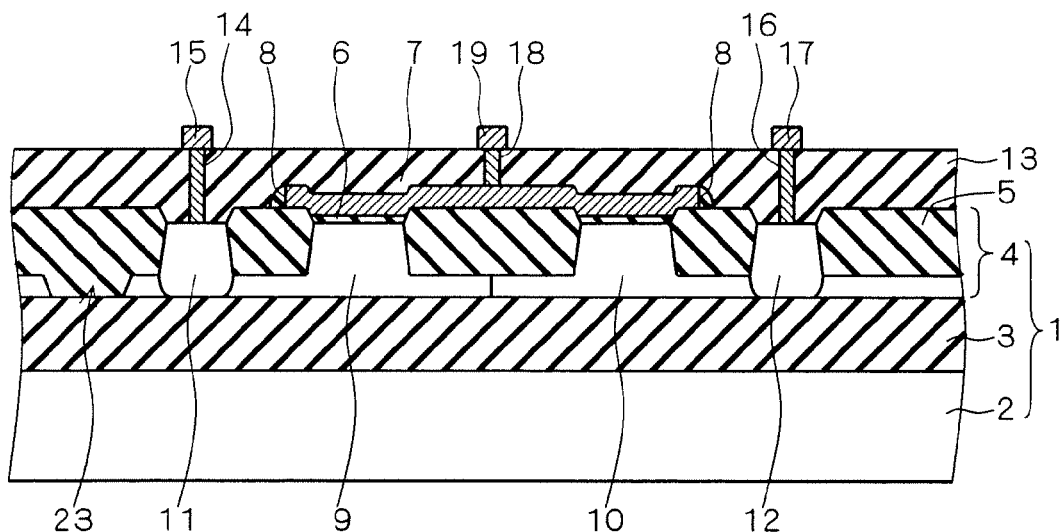
F I G. 17
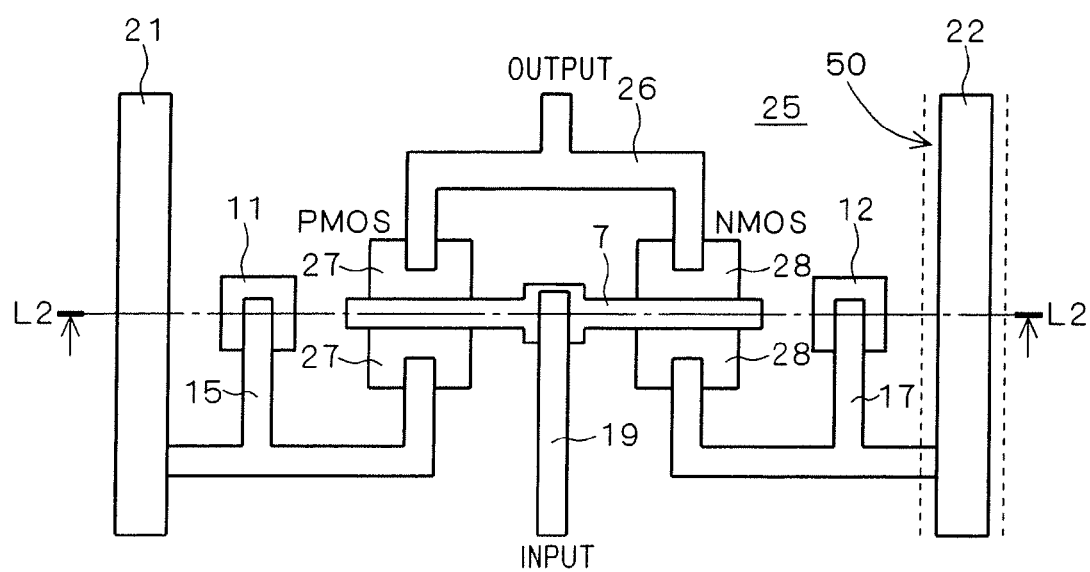

F I G. 18
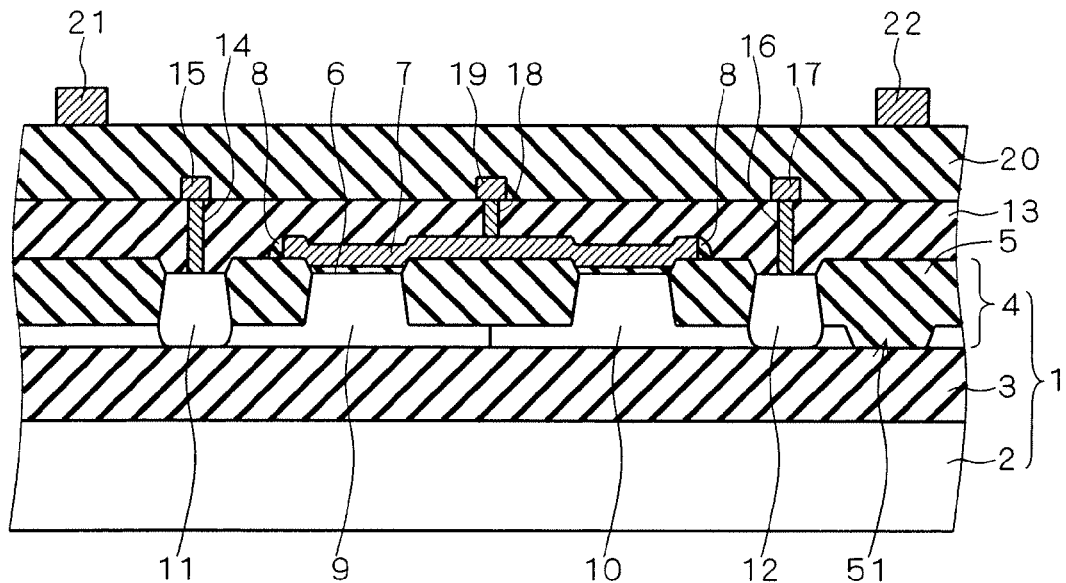
F I G. 19
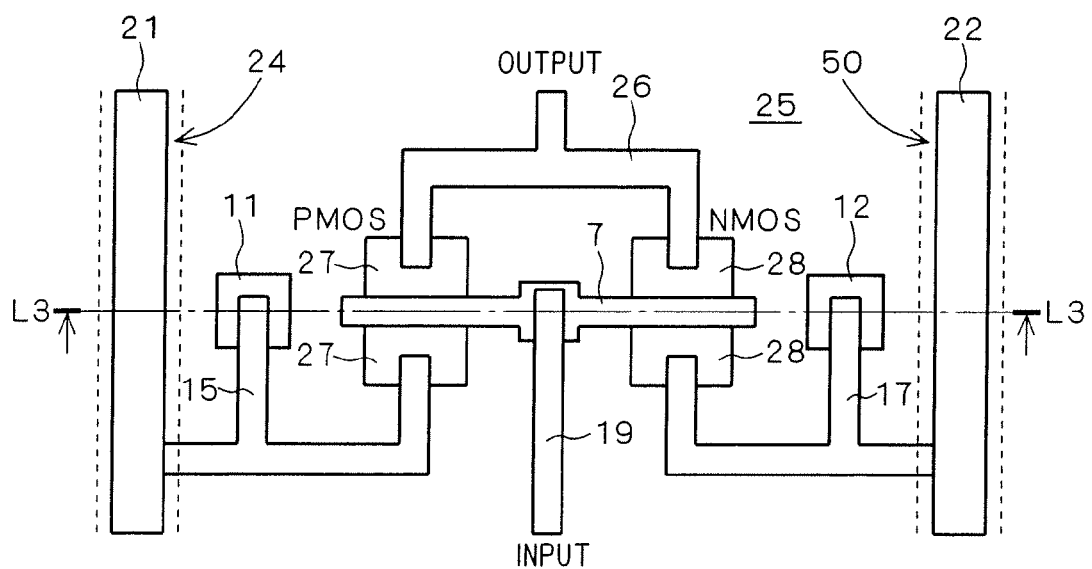

FIG. 26
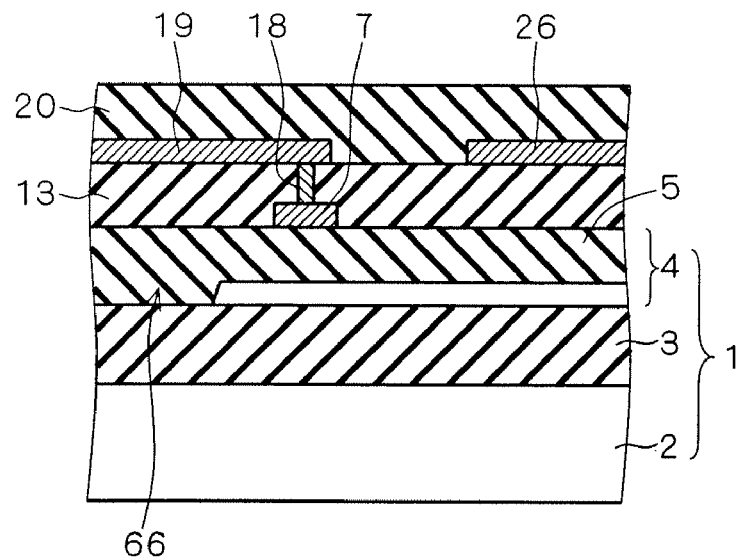
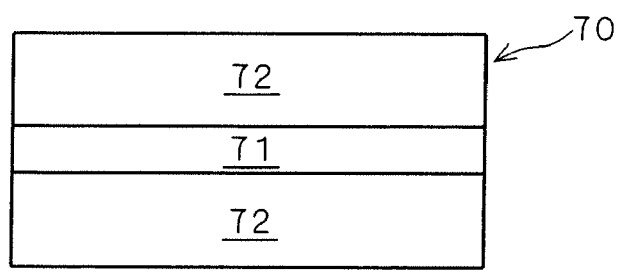
FIG. 27(A)
⇩ LOGIC INVERSION
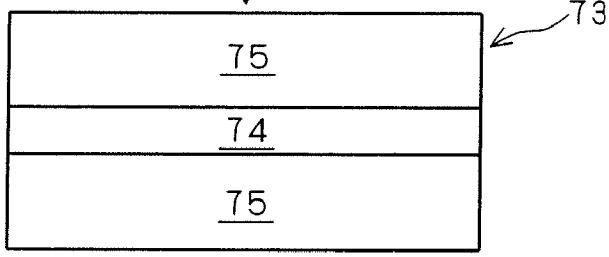
FIG. 27(B)

F I G. 28
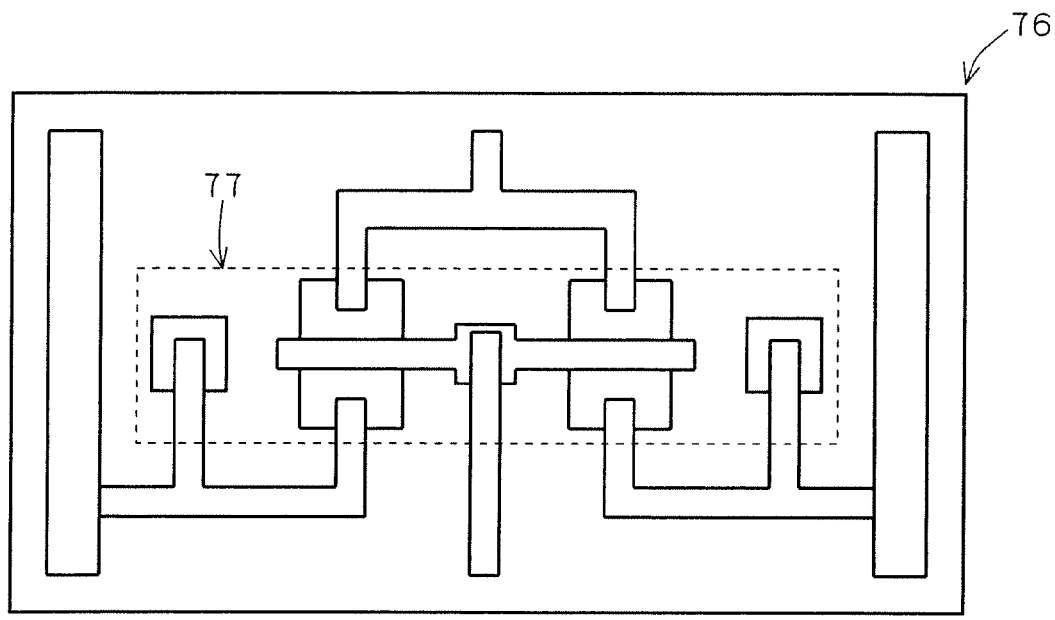
F I G. 29
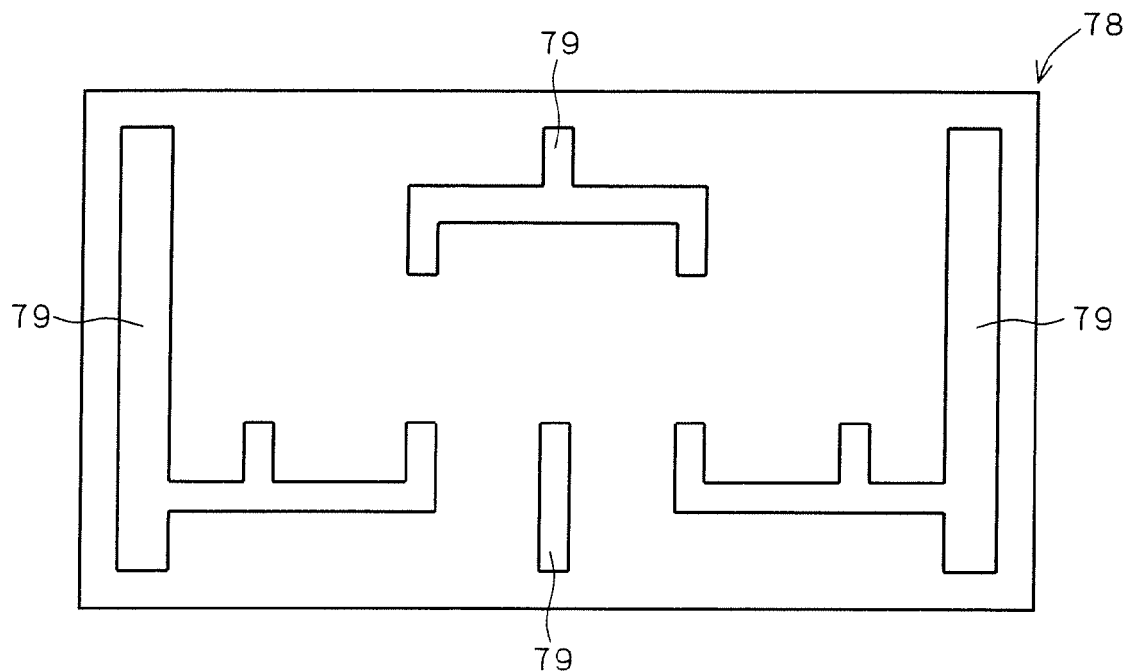

F I G. 30 (A)
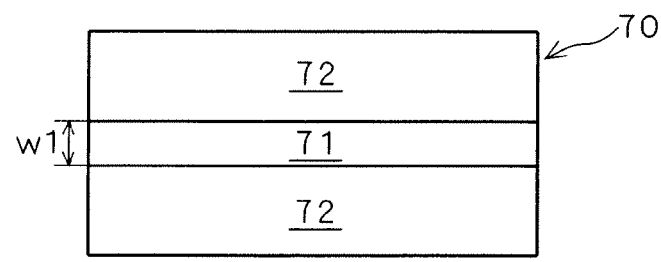
⇩ LOGIC INVERSION
F I G. 30 (B)
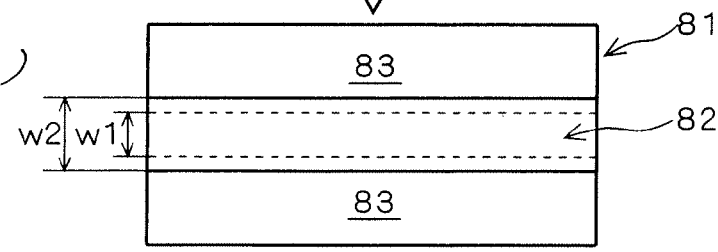
⇩
F I G. 30 (C)
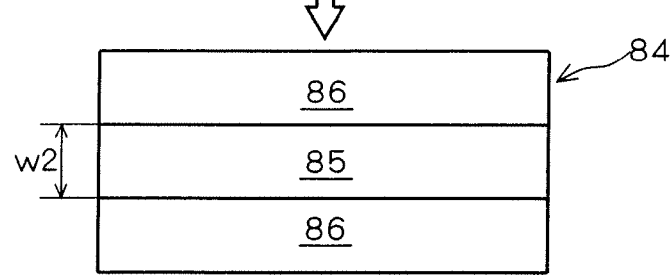

F I G. 43
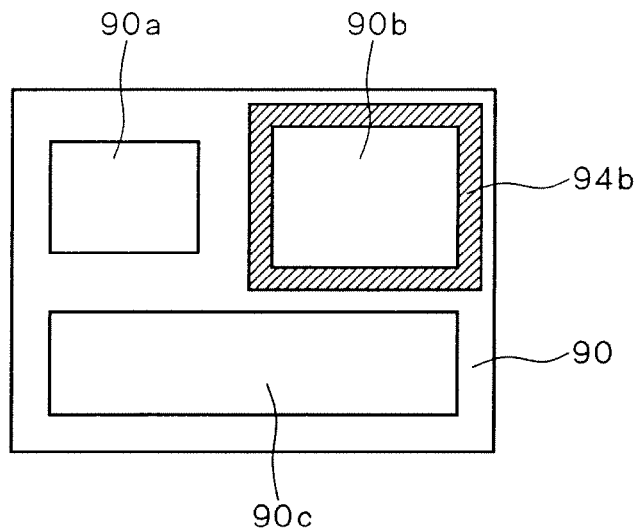
F I G. 44
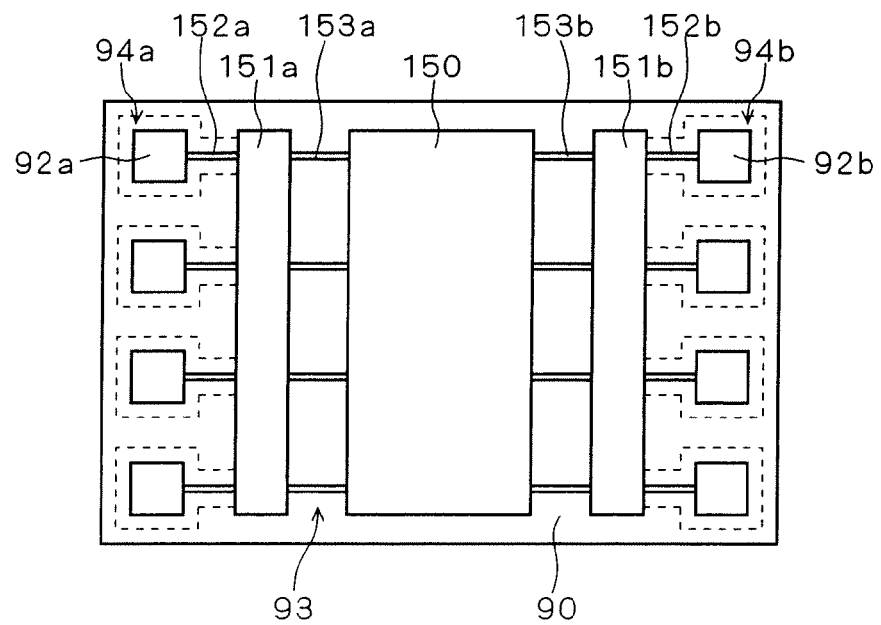

F I G. 45
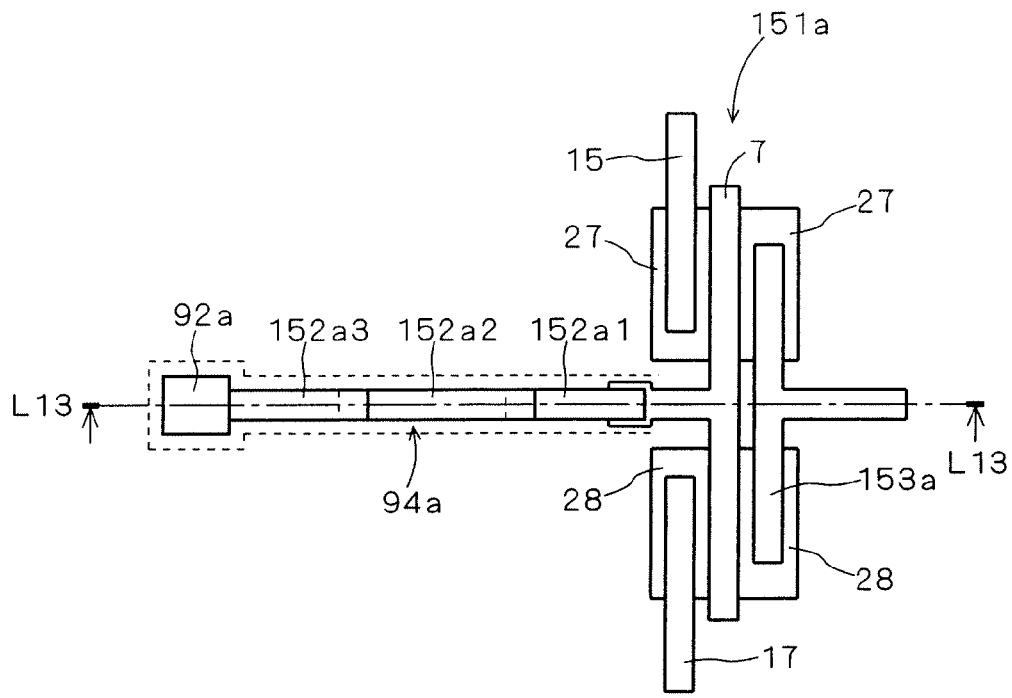
F I G. 46
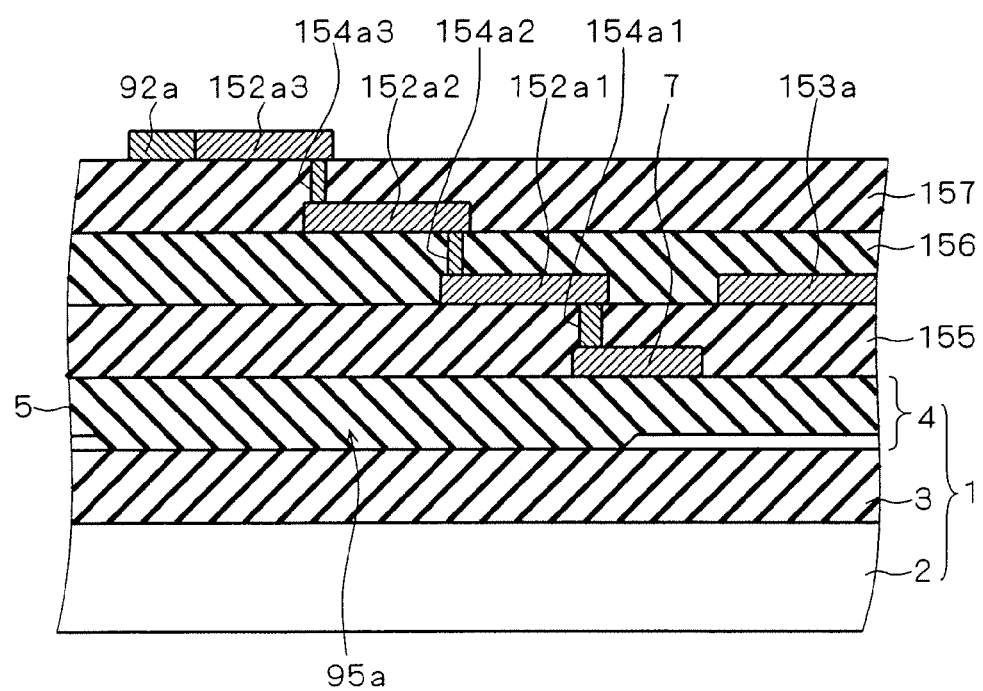

SEMICONDUCTOR DEVICE AND METHOD OF MANUFACTURING THE SAME

CROSS-REFERENCE TO RELATED APPLICATIONS

The present application is a divisional of U.S. application Ser. No. 11/108,843 filed on Apr. 19, 2005, which is a divisional of U.S. application Ser. No. 09/802,886 filed on Mar. 12, 2001, and in turn claims priority to JP 2000-080096 filed on Mar. 22, 2000, and JP 2000-342937 filed on Nov. 10, 2000, the entire contents of each of which are hereby incorporated herein by reference.

BACKGROUND OF THE INVENTION

1. Field of the Invention

The present invention relates to a structure of a semiconductor device and a method of manufacturing the same, and more particularly to a structure of a semiconductor device using an SOI substrate and a method of manufacturing the same.

2. Description of the Background Art

FIG. 47 is a cross section showing a structure of a semiconductor device using an SOI substrate in accordance with a first background art. As shown in FIG. 47, the semiconductor device of the first background art comprises an SOI substrate 101 having a multilayered structure in which a silicon substrate 102, an insulating layer 103 and a silicon layer 104 are layered in this order. In an upper surface of the silicon layer 104, a plurality of isolation insulating films 105 of partial-trench type are selectively formed. In an element formation region of the SOI substrate 101 defined by the isolation insulating films 105, an NMOS transistor (hereinafter, referred to as "NMOS") is formed. The NMOS has an $n^+$-type source region 109s and an $n^+$-type drain region 109d which are formed in the silicon layer 104 and paired with each other with a p-type channel region 110 interposed therebetween. Further, the NMOS has a gate structure which is formed on the channel region 110 and has a multilayered structure in which a gate insulating film 106 and a gate electrode 107 are layered in this order and sidewalls 108 formed on side surfaces of the multilayered structure. Furthermore, in the silicon layer 104, a $p^-$-type body region 111 is selectively formed.

An interlayer insulating film 120 is formed on the NMOS, the isolation insulating film 105 and the body region 111. On the interlayer insulating film 120, wires 113 and 117 are selectively formed. In the interlayer insulating film 120, a contact hole 112 filled with a conductive plug therein is selectively formed to electrically connect the wire 113 and the drain region 109d. Further, in the interlayer insulating film 120, a contact hole 116 filled with a conductive plug therein is selectively formed to electrically connect the wire 117 and the source region 109s.

An interlayer insulating film 121 is formed on the interlayer insulating film 120, and a power supply line 115 and a ground line 119 are selectively formed on the interlayer insulating film 121. In the interlayer insulating film 121, a contact hole 114 filled with a conductive plug therein is selectively formed to electrically connect the power supply line 115 and the wire 113. Further, in the interlayer insulating film 121, a contact hole 118 filled with a conductive plug therein is selectively formed to electrically connect the ground line 119 and the wire 117.

FIG. 48 is a plan view showing a structure of a semiconductor device using an SOI substrate in accordance with a second background art. As shown in FIG. 48, the semiconductor device of the second background art comprises two CMOS transistors (hereinafter, referred to as "CMOS") 140 and 141 formed adjacently to each other with the isolation insulating film 105 of partial-trench type interposed therebetween.

The semiconductor device of the first background art shown in FIG. 47, however, has the following problem. FIGS. 49 and 50 are timing charts used for explaining the problem of the semiconductor device in accordance with the first background art. In a logic circuit using the semiconductor device of FIG. 47, if a reference clock rises when an input potential is "H", an output potential shifts from "L" to "H" (for example time T1 of FIG. 49 and time T3 of FIG. 50) and if the reference clock falls when the input potential is "L", the output potential shifts from "H" to "L" (for example, time T2 of FIG. 49 and time T4 of FIG. 50). As shown in FIG. 47, in the semiconductor device of the first background art, the power supply line 115 and the ground line 119 are formed above the body region 111. Therefore, when the potentials of the power supply line 115 and the ground line 119 are affected by the effect of some external noise to vary, the potential of the body region 111 also varies due to capacitive coupling. The variation in potential of the body region 111 appears as an input noise 130 in an operation of the above logic circuit.

At this time, as shown in FIG. 49, if the operating frequency of the logic circuit is low, ranging from about several KHz to several MHz, and the cycle of the reference clock is sufficiently longer than the waveform of the noise 130, the operation of the logic circuit is hard to be affected by the noise 130. As shown in FIG. 50, however, if the operating frequency of the logic circuit is high, about several GHz, the operation of the logic circuit is likely to be affected by the noise 130. In the case of FIG. 50, the output potential at time T5 shifts from "L" to "H" and the output potential at time T6 shifts from "H" to "L", and as a result a wrong output pulse 131 is generated.

Thus, the semiconductor device of the first background art, which is likely to be affected by variation in potential of the body region and potential of the power supply line and the ground line, has a problem that malfunction is likely to occur as the operating frequency of the semiconductor device becomes high.

The semiconductor device of the second background art of FIG. 48 has the following problem. FIG. 51 is a cross section used for explaining the problem of the semiconductor device in accordance with the second background art. FIG. 51 corresponds to a cross-sectional structure of the semiconductor device of FIG. 48 taken along the line L100, and a left-side transistor of FIG. 51 corresponds to the NMOS included in the CMOS 140 and a right-side transistor corresponds to the NMOS included in the CMOS 141.

It is generally known that an operation of a transistor is likely to be affected by temperature and a current flowing in the transistor is reduced as the ambient temperature gets higher. In the semiconductor device of FIG. 48, it is assumed that the CMOS 140 has a relatively high operating threshold voltage and a large calorific value with large current flow while the CMOS 141 has a relatively low operating threshold voltage and a small calorific value. In this case, the heat generated in the CMOS 140 is conducted to the CMOS 141 through the silicon layer 104 below the isolation insulating film 105 as represented by an arrow 150 of FIG. 51. Then, the heat works to reduce the current in the CMOS 141, making the operation of the CMOS 141 unstable. As a result, malfunction occurs to deteriorate the circuit characteristics especially in a circuit whose operation sensitively depends on magnitude of current such as an analog circuit and an RF circuit.

Thus, in the semiconductor device of the second background art, if two semiconductor elements having different calorific values are formed adjacently to each other, the heat generated in one of the semiconductor elements affects the operation of the other to disadvantageously cause a malfunction.

SUMMARY OF THE INVENTION

The present invention is directed to a semiconductor device. According to a first aspect of the present invention, the semiconductor device comprises: an SOI substrate having a stricture in which a semiconductor substrate, an insulating layer and a semiconductor layer are layered in this order; a partial-isolation insulating film formed in a main surface of the semiconductor layer; a first semiconductor element formed in an element formation region defined by the partial-isolation insulating film in the semiconductor layer; an interlayer insulating film formed on the first semiconductor element and the partial-isolation insulating film; at least one of a power supply line and a ground line formed on the interlayer insulating film; and a first complete-isolation insulating film formed extending from the main surface of the semiconductor layer, reaching an upper surface of the insulating layer below at least one of the power supply line and ground line.

According to a second aspect of the present invention, the semiconductor device of the first aspect further comprises: a second semiconductor element formed adjacently to the first semiconductor element in the semiconductor layer, having an operating threshold voltage different from that of the first semiconductor element; and a second complete-isolation insulating film formed extending from the main surface of the semiconductor layer, reaching the upper surface of the insulating layer between the first semiconductor element and the second semiconductor element.

According to a third aspect of the present invention, the semiconductor device of the first aspect further comprises: a second semiconductor element formed adjacently to the first semiconductor element in the semiconductor layer, having an operating frequency different from that of the first semiconductor element; and a second complete-isolation insulating film formed extending from the main surface of the semiconductor layer, reaching the upper surface of the insulating layer between the first semiconductor element and the second semiconductor element.

According to a fourth aspect of the present invention, the semiconductor device of any one of the first to third aspects further comprises: a signal line formed on the interlayer insulating film, being electrically connected to the first semiconductor element; and a third complete-isolation insulating film formed extending from the main surface of the semiconductor layer, reaching the upper surface of the insulating layer below the signal line.

According to a fifth aspect of the present invention, the semiconductor device of any one of the first to fourth aspects further comprises: a bonding pad formed on the interlayer insulating film, for electrically connecting the first semiconductor element and an outer element; and a fourth complete-isolation insulating film formed extending from the main surface of the semiconductor layer, reaching the upper surface of the insulating layer below the bonding pad.

According to a sixth aspect of the present invention, the semiconductor device comprises: an SOI substrate having a structure in which a semiconductor substrate, an insulating layer and a semiconductor layer are layered in this order; a partial-isolation insulating film formed in a main surface of the semiconductor layer; a first semiconductor element formed in an element formation region defined by the partial-isolation insulating film in the semiconductor layer; a second semiconductor element formed adjacently to the first semiconductor element in the semiconductor layer having an operating threshold voltage different from that of the first semiconductor element; and a complete-isolation insulating film formed extending from the main surface of the semiconductor layer, reaching the upper surface of the insulating layer between the first semiconductor element and the second semiconductor element.

According to a seventh aspect of the present invention, the semiconductor device comprises: an SOI substrate having a structure in which a semiconductor substrate, an insulating layer and a semiconductor layer are layered in this order; a partial-isolation insulating film formed in a main surface of the semiconductor layer; a first semiconductor element formed in an element formation region defined by the partial-isolation insulating film in the semiconductor layer; a second semiconductor element formed adjacently to the first semiconductor element in the semiconductor layer, having an operating frequency different from that of the first semiconductor element; and a complete-isolation insulating film formed extending from the main surface of the semiconductor layer, reaching the upper surface of the insulating layer between the first semiconductor element and the second semiconductor element.

According to an eighth aspect of the present invention, the semiconductor device comprises: an SOI substrate having a structure in which a semiconductor substrate, an insulating layer and a semiconductor layer are layered in this order; a partial-isolation insulating film formed in a main surface of the semiconductor layer; a semiconductor element formed in an element formation region defined by the partial-isolation insulating film in the semiconductor layer; an interlayer insulating film formed on the semiconductor element and the partial-isolation insulating film; a signal line formed on the interlayer insulating film, being electrically connected to the semiconductor element; and a complete-isolation insulating film formed extending from the main surface of the semiconductor layer, reaching the upper surface of the insulating layer below the signal input line.

According to a ninth aspect of the present invention, in the semiconductor device of the eighth aspect, the signal line has a plurality of wires constituting a multilayer interconnection structure, and the complete-isolation insulating film is formed below at least one of the plurality of wires which exists in the lowest layer.

According to a tenth aspect of the present invention, in the semiconductor device of the ninth aspect, the complete-isolation insulating film is also formed below one of the plurality of wires which exists in the layer nearest to the SOI substrate but the lowest layer.

According to an eleventh aspect of the present invention, in the semiconductor device of any one of the eighth to tenth aspects, the signal line propagates a signal having a frequency not less than GHz order.

According to a twelfth aspect of the present invention, in the semiconductor device of the eighth aspect, the semiconductor element is a buffer circuit, and the signal line connects the buffer circuit and a bonding pad connected to an external device.

According to a thirteenth aspect of the present invention, the semiconductor device comprises: an SOI substrate having a structure in which a semiconductor substrate, an insulating layer and a semiconductor layer are layered in this order, a partial-isolation insulating film formed in a main surface of the semiconductor layer; a semiconductor element formed in an element formation region defined by the partial-isolation insulating film in the semiconductor layer; an interlayer insulating film formed on the semiconductor element and the partial-isolation insulating film; a bonding pad formed on the interlayer insulating film, for electrically connecting the first semiconductor element and an outer element; and a complete-isolation insulating film formed extending from the main surface of the semiconductor layer, reaching the upper surface of the insulating layer below the bonding pad.

According to a fourteenth aspect of the present invention, the semiconductor device comprises: an SOI substrate having a structure in which a semiconductor substrate, an insulating layer and a semiconductor layer are layered in this order; a partial-isolation insulating film formed in a main surface of the semiconductor layer; a semiconductor element including a channel region formed in the semiconductor layer in an element formation region defined by the partial-isolation insulating film; an interlayer insulating film formed on the semiconductor element and the partial-isolation insulating film: at least one of a power supply line and a ground line formed on the interlayer insulating film; and a high-resistance region formed below at least one of the power supply line and ground line in the semiconductor layer, having a resistance higher than that of the channel region.

The present invention is also directed to a method of manufacturing a semiconductor device. According to a fifteenth aspect of the present invention, the method of manufacturing a semiconductor device comprises the steps of: (a) preparing an SOI substrate having a structure in which a semiconductor substrate, an insulating layer and a semiconductor layer are layered in this order; (b) forming a partial-isolation insulating film in a main surface of the semiconductor layer and forming a first complete-isolation insulating film so as to extend from the main surface of the semiconductor layer and reach an upper surface of the insulating layer below a region in which at least one of a power supply line and a ground line is to be formed; (c) forming a first semiconductor element in an element formation region defined by the partial-isolation insulating film in the semiconductor layer; (d) forming an interlayer insulating film on the first semiconductor element, the partial-isolation insulating film and the first complete-isolation insulating film; and (e) forming at least one of the power supply line and the ground line on the interlayer insulating film.

According to a sixteenth aspect of the present invention, the method of manufacturing a semiconductor device of the fifteenth aspect further comprises the steps of: (f) forming a second semiconductor element adjacently to the first semiconductor element in the semiconductor layer, to have an operating threshold voltage different from that of the first semiconductor element; and (g) forming a second complete-isolation insulating film so as to extend from the main surface of the semiconductor layer and reach the upper surface of the insulating layer between the first semiconductor element and the second semiconductor element.

According to a seventeenth aspect of the present invention, the method of manufacturing a semiconductor device of the fifteenth aspect further comprises the steps of: (f) forming a second semiconductor element adjacently to the first semiconductor element in the semiconductor layer, to have an operating frequency different from that of the first semiconductor element; and (g) forming a second complete-isolation insulating film so as to extend from the main surface of the semiconductor layer and reach the upper surface of the insulating layer between the first semiconductor element and the second semiconductor element.

According to an eighteenth aspect of the present invention, the method of manufacturing a semiconductor device of any one of the fifteenth to seventeenth aspects further comprises the steps of: (h) forming a third complete-isolation insulating film so as to extend from the main surface of the semiconductor layer and reach the upper surface of the insulating layer below a region in which a signal line electrically connected to the first semiconductor element is to be formed; and (i) forming the signal line on the interlayer insulating film.

According to a nineteenth aspect of the present invention, the method of manufacturing a semiconductor device of any one of the fifteenth to eighteenth aspects further comprises the steps of: (j) forming a fourth complete-isolation insulating film so as to extend from the main surface of the semiconductor layer and reach the upper surface of the insulating layer below a region in which a bonding pad for electrically connecting the first semiconductor element and an outer element is to be formed; and (k) forming the bonding pad on the interlayer insulating film.

According to a twentieth aspect of the present invention, in the method of manufacturing a semiconductor device of the fifteenth aspect the step (b) has the steps of (x) excavating the main surface of the semiconductor layer by a predetermined film thickness in a region in which the partial-isolation insulating film is to be formed and a region in which the first complete-isolation insulating film is to be formed to form, a first recess; (y) selectively excavating a bottom surface of the first recess exposed in the step (x) in the region in which the first complete-isolation insulating film is to be formed until the upper surface of the insulating layer is exposed, to form a second recess; and (z) burying an insulating film in the first recess and the second recess.

According to a twenty-first aspect of the present invention, in the method of manufacturing a semiconductor device of the twentieth aspect, the step (y) has the steps of (y-1) forming a photoresist on a structure obtained in the step (x); (y-2) exposing the photoresist by using a photomask having a predetermined mask pattern; (y-3) developing the photoresist after being exposed; and (y-4) etching the semiconductor layer with the photoresist after being developed used as an etching mask, to form the second recess, and in the method of the seventeenth aspect, the predetermined mask pattern is automatically formed on the basis of a wiring layout representing a region in which at least one of the power supply line and the ground line is to be formed.

In the semiconductor device of the first aspect of the present invention, the first complete-isolation insulating film is formed below at least one of the power supply line and the ground line. Therefore, even if the potential of at least one of the power supply line and ground line varies due to the effect of some external noise, it is possible to prevent variation in potential of the semiconductor layer caused by the above potential variation.

In the semiconductor device of the second aspect of the present invention, the second complete-isolation insulating film is formed between the first semiconductor element and the second semiconductor element having different operating threshold voltages. Therefore, since conduction of the heat generated in one of the first and second semiconductor elements to the other semiconductor element can be suppressed, it is possible to prevent unstable operations of the first and second semiconductor elements due to the heat.

In the semiconductor device of the third aspect of the present invention, the second complete-isolation insulating film is formed between the first semiconductor element and the second semiconductor element having different operating frequencies. Therefore, it is possible to prevent the potential at the semiconductor layer in a portion where the first semiconductor element is formed and that at the semiconductor layer in a portion where the second semiconductor element is formed from affecting each other due to the difference in operating frequency.

In the semiconductor device of the fourth aspect of the present invention, the third complete-isolation insulating film is formed below the signal line. Therefore, even if the potential of the signal line varies due to the effect of external noise, it is possible to prevent variation in potential of the semiconductor layer caused by the potential variation of the signal line.

In the semiconductor device of the fifth aspect of the present invention, the fourth complete-isolation insulating film is formed below the bonding pad. Therefore, even if some external noise is propagated from the outer element through the bonding pad, it is possible to prevent variation in potential of the semiconductor layer caused by the noise.

In the semiconductor device of the sixth aspect of the present invention, the complete-isolation insulating film is formed between the first semiconductor element and the second semiconductor element having different operating threshold voltages. Therefore, since conduction of the heat generated in one of the first and second semiconductor elements to the other semiconductor element can be suppressed, it is possible to prevent unstable operations of the first and second semiconductor elements due to the heat.

In the semiconductor device of the seventh aspect of the present invention, the complete-isolation insulating film is formed between the first semiconductor element and the second semiconductor element having different operating frequencies. Therefore, it is possible to prevent the potential at the semiconductor layer in a portion where the first semiconductor element is formed and that at the semiconductor layer in a portion where the second semiconductor element is formed from affecting each other due to the difference in operating frequency.

In the semiconductor device of the eighth aspect of the present invention, the complete-isolation insulating film is formed below the signal line. Therefore, even if the potential of the signal line varies due to the effect of external noise, it is possible to prevent variation in potential of the semiconductor layer caused by the potential variation of the signal line.

In the semiconductor device of the ninth aspect of the present invention, the complete-isolation insulating film is formed below the wire in the lowest layer of the multilayer interconnection structure, which is likely to affect the potential of the semiconductor layer. Therefore, even if the potential of the wire in the lowest layer varies due to the effect of some external noise, it is possible to prevent variation in potential of the semiconductor layer caused by the above potential variation.

In the semiconductor device of the tenth aspect of the present invention, even if the potentials of the wire in the lowest layer and the wire in the layer nearest to the SOI substrate but the lowest layer vary due to the effect of some external noise, it is possible to prevent variation in potential of the semiconductor layer caused by the above potential variation.

In the semiconductor device of the eleventh aspect of the present invention, the complete-isolation insulating film is formed below the signal line in the first region which incorporates the first circuit which is more affected by some noise than the second circuit. Therefore, since it is possible to prevent variation in potential of the semiconductor layer caused by the variation in potential of the signal line, the first circuit which is likely to be affected by some noise can be stably operated.

In the semiconductor device of the twelfth aspect of the present invention, the complete-isolation insulating film is formed below the signal line which connects the buffer circuit and the bonding pad. Therefore, even if the potential of the wire varies due to the effect of some noise inputted from the external device, it is possible to prevent variation in potential of the semiconductor layer which exists below the wire caused by the above potential variation.

In the semiconductor device of the thirteenth aspect of the present invention, the complete-isolation insulating film is formed below the bonding pad. Therefore, even if some external noise is propagated from the outer element through the bonding pad, it is possible to prevent variation in potential of the semiconductor layer caused by the noise.

In the semiconductor device of the fourteenth aspect of the present invention, even if the potential of at least one of the power supply line and ground line varies due to the effect of some external noise, since capacitive coupling is hard to occur between the high-resistance region and at least one of the power supply line and ground line, it is possible to prevent variation in potential of the semiconductor layer caused by the potential variation of at least one of the power supply line and ground line.

In the method of the fifteenth aspect of the present invention, the first complete-isolation insulating film, instead of a partial-isolation insulating film, is formed below at least one of the power supply line and the ground line. Therefore, it is possible to obtain a semiconductor device in which the potential of the semiconductor layer does not vary in response to the variation in potential of at least one of the power supply line and ground line caused by external noise.

In the method of the sixteenth aspect of the present invention, the second complete-isolation insulating film, instead of a partial-isolation insulating film, is formed between the first semiconductor element and the second semiconductor element having different operating threshold voltages. Therefore, since conduction of the heat generated in one of the first and second semiconductor elements to the other semiconductor element can be suppressed, it is possible to obtain a semiconductor device capable of performing a stable operation against heat generation.

In the method of the seventeenth aspect of the present invention, the second complete-isolation insulating film, instead of a partial-isolation insulating film, is formed between the first semiconductor element and the second semiconductor element having different operating frequencies. Therefore, it is possible to obtain a semiconductor device which can prevent the potential at the semiconductor layer in a portion where the first semiconductor element is formed and that at the semiconductor layer in a portion where the second semiconductor element is formed from affecting each other due to the difference in operating frequency.

In the method of the eighteenth aspect of the present invention, the third complete-isolation insulating film, instead of a partial-isolation insulating film, is formed below the signal line. Therefore, it is possible to obtain a semiconductor device in which the potential of the semiconductor layer does not vary in response to the variation in potential of the signal line caused by external noise.

In the method of the nineteenth aspect of the present invention, the fourth complete-isolation insulating film, instead of a partial-isolation insulating film, is formed below the bonding pad. Therefore, it is possible to obtain a semiconductor device in which the potential of the semiconductor layer does not vary due to some external noise even if the external noise is propagated from the outer element through the bonding pad.

In the method of the twentieth aspect of the present invention, the first complete-isolation insulating film can be formed as the complete isolation portion selectively formed in the partial-isolation insulating film together with the partial-isolation insulating film.

In the method of the twenty-first aspect of the present invention, it is possible to easily form the mask pattern of the photomask used in exposing the photoresist with reference to the wiring layout representing a region in which at least one of the power supply line and ground line is to be formed.

The present invention has two objects. The first object of the present invention is to provide a semiconductor device which can suppress variation in potential of a body region caused by variation in potential of the power supply line and ground line to prevent malfunction even if an operating frequency of the semiconductor device is high, and provide a method of manufacturing the semiconductor device. The second object of the present invention is to provide a semiconductor device which can relieve an effect produced by the heat generated in one of two semiconductor elements which have different calorific values and are formed adjacently to each other on the operation of the other of the semiconductor elements to prevent malfunction, and provide a method of manufacturing the semiconductor device.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a plan view showing a structure of a semiconductor device in accordance with a first preferred embodiment of the present invention;

FIG. 2 is a cross section showing a cross-sectional structure of the semiconductor device of FIG. 1;

FIGS. 3 to 16 are cross sections showing a method of manufacturing the semiconductor device in accordance with the first preferred embodiment of the present invention step by step;

FIG. 17 is a plan view showing a structure of a semiconductor device in accordance with a second preferred embodiment of the present invention;

FIG. 18 is a cross section showing a cross-sectional structure of the semiconductor device of FIG. 17;

FIG. 19 is a plan view showing a structure of a semiconductor device in accordance with a third preferred embodiment of the present invention;

FIG. 26 is a cross section showing a cross-sectional structure of the semiconductor device of FIG. 25;

FIGS. 27(A) and 27(B), 28 and 29 are conceptional diagrams showing a method of forming a mask pattern in accordance with a seventh preferred embodiment of the present invention;

FIGS. 30(A) to (C) and 31 are conceptional diagrams showing another method of forming a mask pattern in accordance with the seventh preferred embodiment of the present invention;

FIG. 43 is a plan view showing another structure of a semiconductor device in accordance with the eleventh preferred embodiment of the present invention;

FIG. 44 is a plan view showing a structure of a semiconductor device in accordance with a twelfth preferred embodiment of the present invention;

FIG. 45 is an enlarged plan view showing a connection between a bonding pad and an input buffer circuit;

FIG. 46 is a cross section showing a cross-sectional structure of the semiconductor device of FIG. 45;

DESCRIPTION OF THE PREFERRED EMBODIMENTS

Figure 6:
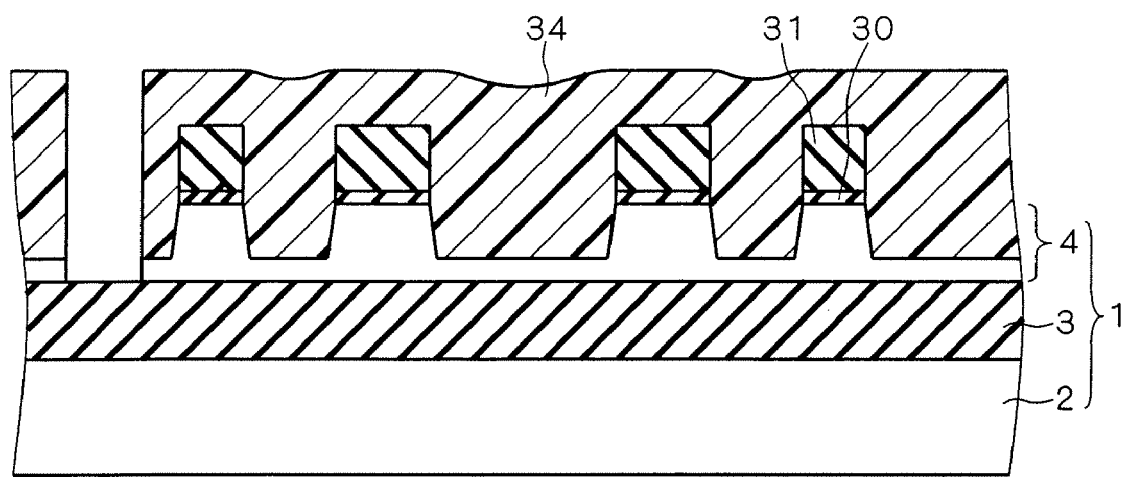

Hereinafter, the preferred embodiments of the present invention will be specifically discussed, taking a case of CMOS as an example.

The First Preferred Embodiment

FIG. 1 is a plan view showing a structure of a semiconductor device in accordance with the first preferred embodiment of the present invention, and FIG. 2 is a cross section showing a cross-sectional structure of the semiconductor device of FIG. 1 taken along the line L1. In FIG. 1, interlayer insulating films 13 and 20 and a sidewall 8 described later are not shown, for convenience of illustration. With reference to FIGS. 1 and 2, the semiconductor device of the first preferred embodiment comprises an SOI substrate 1 having a multilayered structure in which a silicon substrate 2, an insulating layer 3 and a silicon layer 4 are layered in this order. In an upper surface of the silicon layer 4, isolation insulating films 5 of partial-trench type are selectively formed. In element formation regions of the SOI substrate 1 defined by the isolation insulating films 5, a PMOS and an NMOS are formed.

The NMOS has $n^+$-type source/drain regions 28 which are formed in the silicon layer 4 and paired with each other with a p-type impurity introduction region (channel region) 10 interposed therebetween. Further, the NMOS has a gate structure including a multilayered structure in which a gate insulating film 6 and a gate electrode 7 are layered in this order which is formed on the impurity introduction region 10 and the sidewalls 8 formed on side surfaces of the multilayered structure.

Similarly, the PMOS has $p^+$-type source/drain regions 27 which are formed in the silicon layer 4 and paired with each other with an n-type impurity introduction region (channel region) 9 interposed therebetween. Further, the PMOS has a gate structure including a multilayered structure in which the gate insulating film 6 and the gate electrode 7 are layered in this order which is formed on the impurity introduction region 9 and the sidewalls 8 formed on side surfaces of the multilayered structure. The gate electrode 7 extends on the isolation insulating film 5 between the PMOS and NMOS and the gate electrode 7 of the PMOS and that of NMOS are formed as a unit. Furthermore, in the silicon layer 4, a $p^-$-type body region 12 and an $n^-$-type body region 11 are selectively formed.

On the NMOS, the PMOS, the isolation insulating film 5 and the body regions 11 and 12, the interlayer insulating film 13 is formed. On the interlayer insulating film 13, wires 15, 17, 19 and 26 are selectively formed. In the interlayer insulating film 13, contact holes 14, 16 and 18 each filled with conductive plugs therein are selectively formed to electrically connect the wire 15 and the body region 11, the wire 17 and the body region 12, and the wire 19 and the gate electrode 7, respectively. Further, with reference to FIG. 1, the wires 15 and 17 are electrically connected to the source/drain regions 27 and 28, respectively, through contact holes (not shown) which are selectively formed in the interlayer insulating film 13 and filled with conductive plugs therein, and the wire 26 is electrically connected to the source/drain regions 27 and 28 through contact holes (not shown) which are selectively formed in the interlayer insulating film 13 and filled with conductive plugs therein.

With reference to FIG. 2, the interlayer insulating film 20 is formed on the interlayer insulating film 13. On the interlayer insulating film 20, a power supply line 21 and a ground line 22 are selectively formed. Both the power supply line 21 and the ground line 22 are formed above the isolation insulating film 5. Below the power supply line 21, a complete isolation portion 23 reaching an upper surface of the insulating layer 3 is formed in the isolation insulating film 5. In other words, the semiconductor device of the first preferred embodiment comprises a complete-isolation insulating film which is so formed as to extend from the upper surface of the silicon layer 4 and reach the upper surface of the insulating layer 3 below the power supply line 21. The complete isolation portion 23 of FIG. 2 is formed in a complete isolation region 24 of FIG. 1 and the partial-isolation insulating film 5 of FIG. 2 is formed in a partial isolation region 25 of FIG. 1. With reference to FIG. 1, the power supply line 21 and the ground line 22 are electrically connected to the wires 15 and 17, respectively, through contact holes (not shown) which are selectively formed in the interlayer insulating film 20 and filled with conductive plugs therein.

FIGS. 3 to 16 are cross sections showing a method of manufacturing the semiconductor device in accordance with the first preferred embodiment of the present invention step by step. First prepared is the SOI substrate 1 having the multilayered structure in which the silicon substrate 2, the insulating layer 3 which is made of a silicon oxide film and has a film thickness of about 4000 angstroms and the silicon layer 4 which has a film thickness of about 2000 angstroms are layered in this order (FIG. 3). Next, a silicon oxide film 30 having a thickness of about 200 angstroms is entirely formed on the silicon layer 4. After that, a silicon nitride film 31 having a thickness of about 2000 angstroms is entirely formed on the silicon oxide film 30 (FIG. 4).

Next, after a photoresist is entirely formed on the silicon nitride film 31, the photoresist is exposed by using a photomask (not shown) having a mask pattern corresponding to a formation layout of the isolation insulating film 5. After that, the photoresist is developed to form a photoresist 32 having an opening pattern above a region in which the isolation insulating film 5 is to be formed. Then, the silicon nitride film 31, the silicon oxide film 30 and the silicon layer 4 are anisotropically dry-etched with the photoresist 32 used as an etching mask. This etching is performed until the silicon layer 4 is etched up to the depth of about 500 to 1000 angstroms from its upper surface. Through this etching, a recess 33 is selectively formed in the upper surface of the silicon layer 4 (FIG. 5).

Next, after removing the photoresist 32, a photoresist 34 having an opening pattern above a region in which the complete isolation portion 23 is to be formed (FIG. 6). For example, after entirely applying a positive-type photoresist, the photoresist is exposed by using a photomask (not shown) having a mask pattern with an opening portion above the region in which the complete isolation portion 23 is to be formed, and then the photoresist in the exposed portion is removed by dissolution with a developer.

Figure 7:
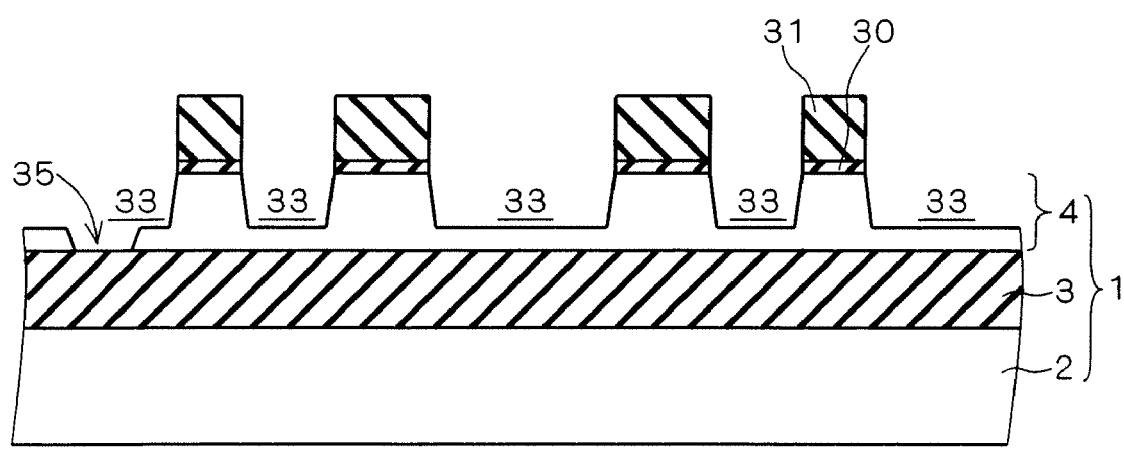
Figure 8:
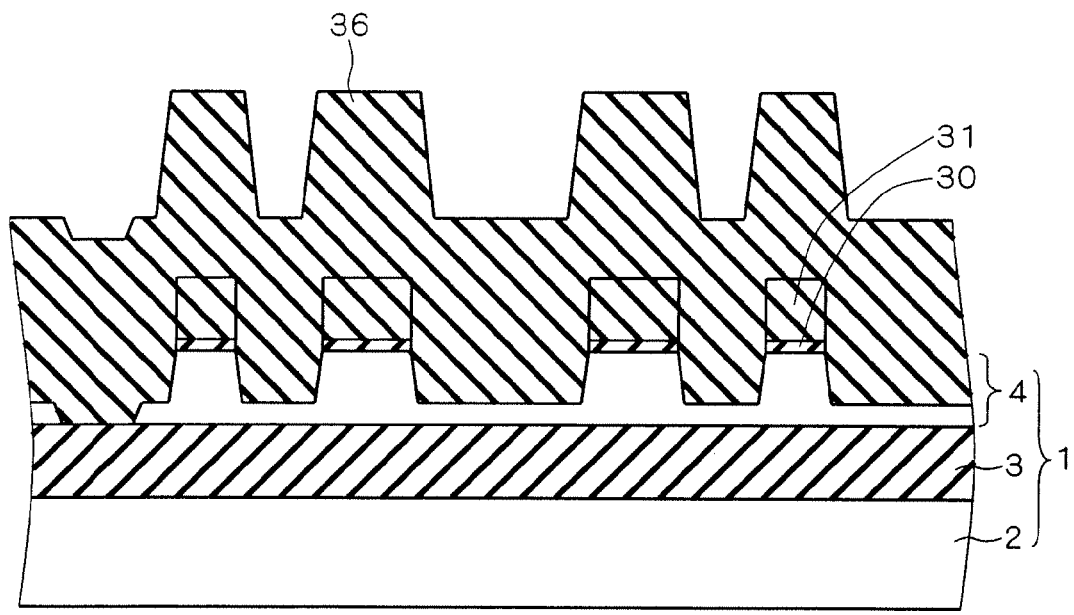

Next, the silicon layer 4 is etched with the photoresist 34 used as the etching mask. Through this etching, a bottom surface of the recess 33 in the region in which the complete isolation portion 23 is to be formed is excavated and the upper surface of the insulating layer 3 is thereby exposed, to form a recess 35. After that, the photoresist 34 is removed (FIG. 7). Subsequently, a silicon oxide film 36 having a thickness of about 5000 angstroms is entirely deposited by the CVD method. The recesses 33 and 35 are thereby filled with the silicon oxide film 36 (FIG. 8).

Figure 9:
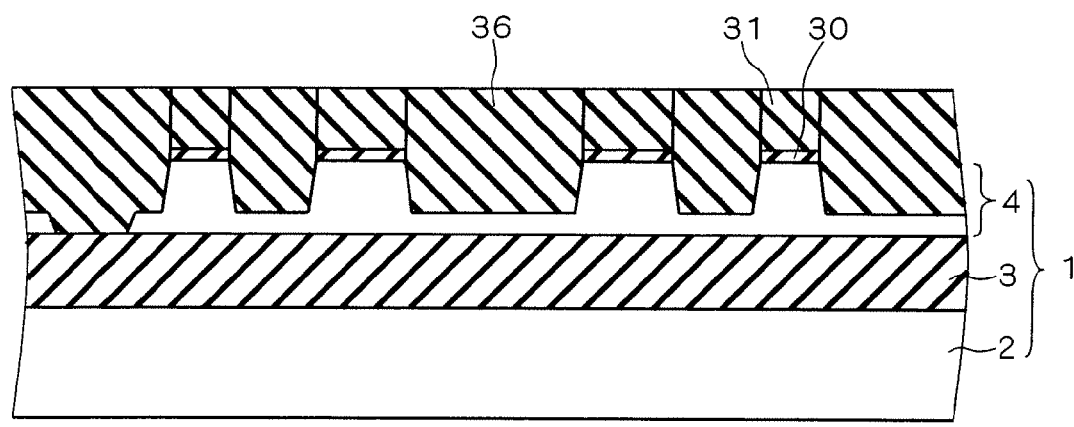
Figure 10:
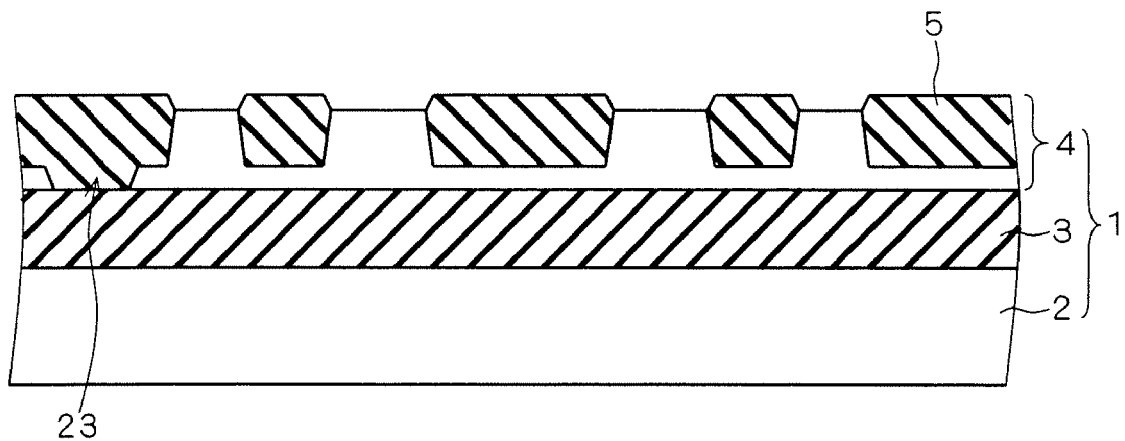
Figure 11:
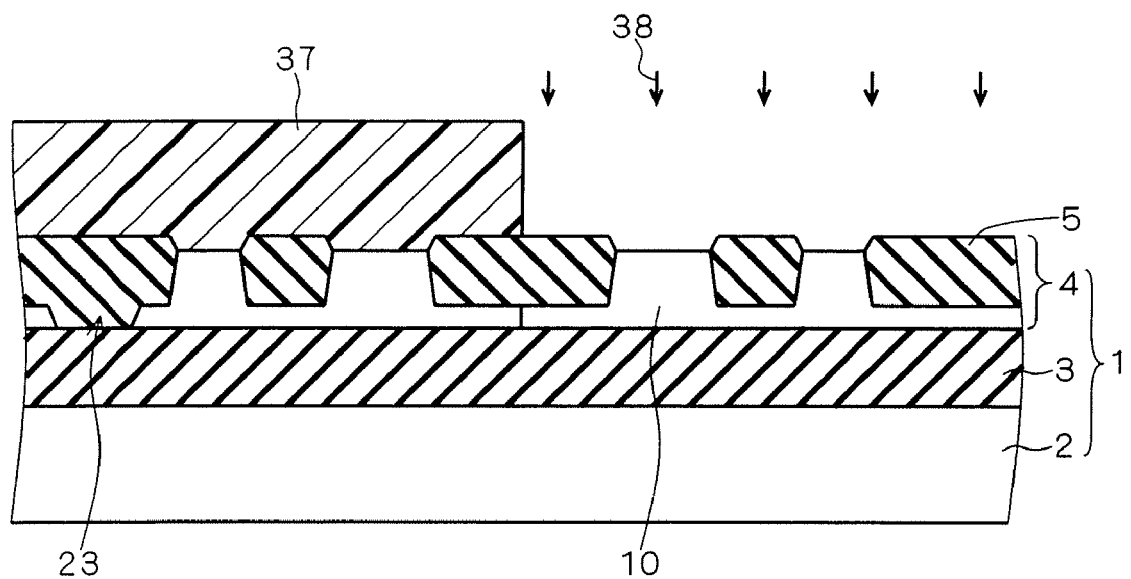

Next, the silicon oxide film 36 is polished by the CMP method to be removed until an upper surface of the silicon nitride film 31 (FIG. 9). Subsequently, after removing an upper portion of the silicon oxide film 36 by wet etching, the silicon nitride film 31 and the silicon oxide film 30 are removed. Through this removing, the isolation insulating film 5 is obtained as the silicon oxide film 36 left in the recesses 33 and 35 (FIG. 10).

Figure 12:
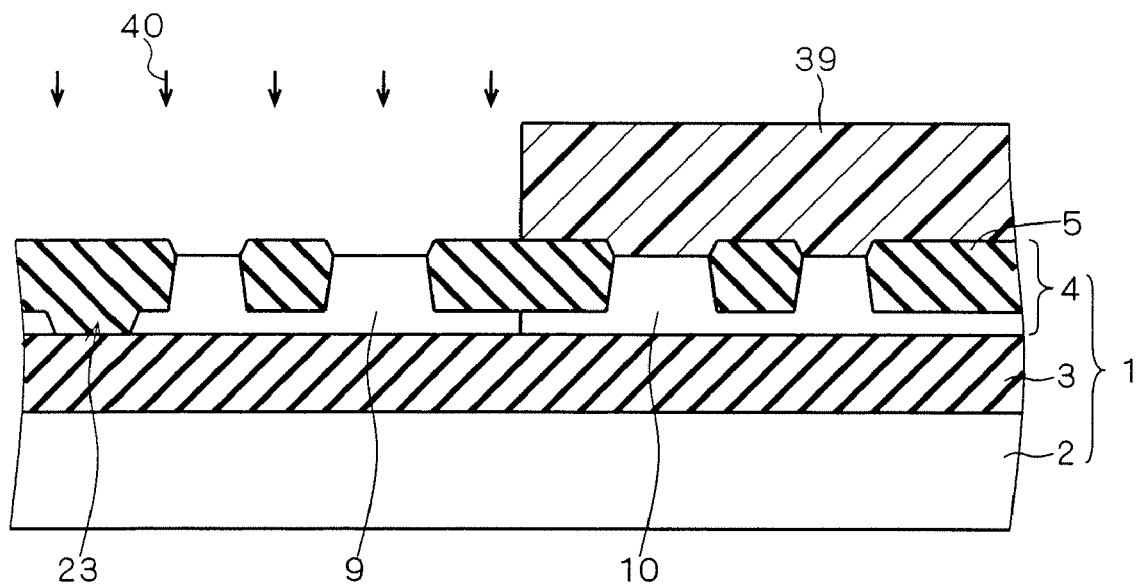

Next, after forming a photoresist 37 having an opening pattern above a region in which the NMOS is to be formed, an impurity 38 such as boron is ion-implanted at an energy of several tens keV at a dose of several e12 $cm^{-2}$, to form the impurity introduction region 10 in the silicon layer 4. Subsequently, after removing the photoresist 37, a photoresist 39 having an opening pattern above a region in which the PMOS is to be formed and then an impurity 40 such as phosphorus is ion-implanted at an energy of several hundreds keV at a dose of several e12 cm$^{-2}$, to form the impurity introduction region 9 in the silicon layer 4 (FIG. 12).

Figure 13:
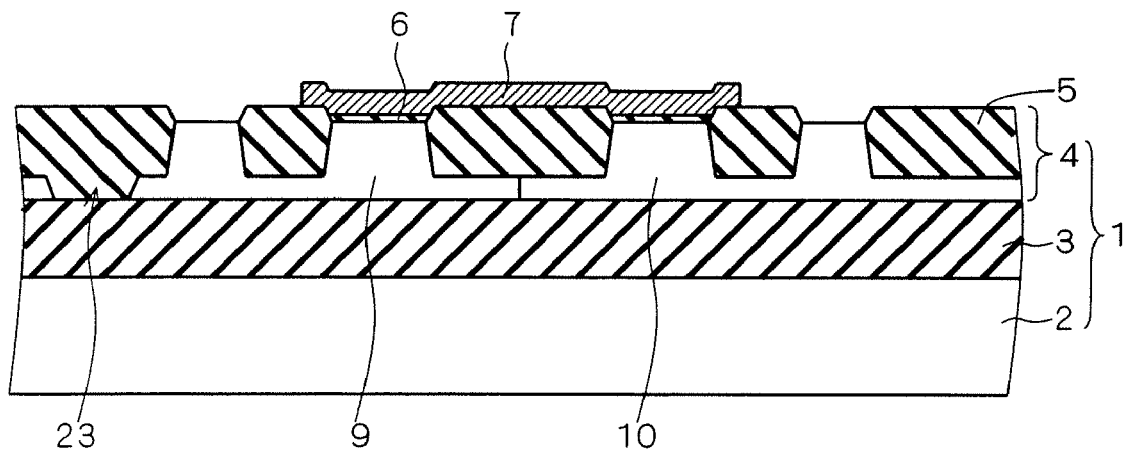

Next, after the gate insulating film 6 is formed on the upper surface of the silicon layer 4 by the thermal oxidation method, a polysilicon film having a thickness of about 3000 angstroms is deposited by the CVD method and the polysilicon film is patterned to form the gate electrode 7. Thereby obtained is the gate structure having the multilayered structure in which the gate insulating film 6 and the gate electrode 7 are layered in this order (FIG. 13).

Figure 14:
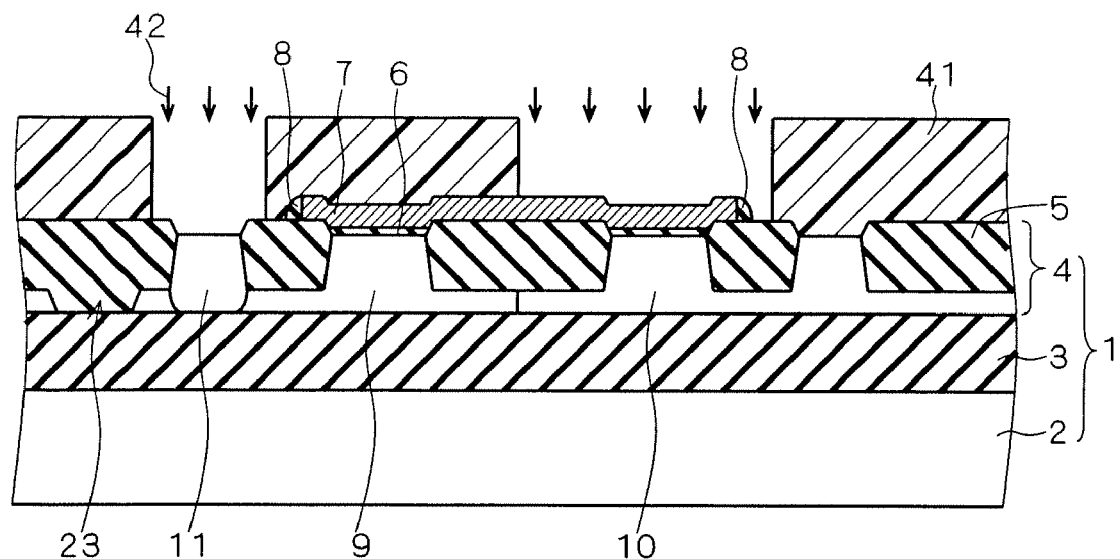
Figure 15:
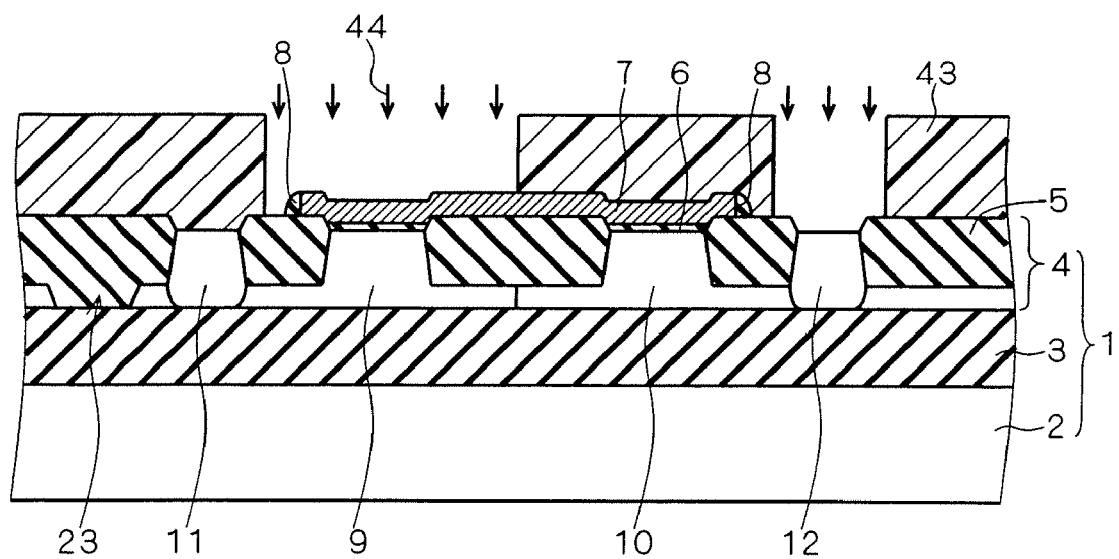

Next, after the sidewall 8 is formed on the side surface of the gate structure, formed is a photoresist 41 having an opening pattern above regions in which the body region 11 and the source/drain regions 28 are to be formed. After that, an impurity 42 such as arsenic is ion-implanted at an energy of several tens keV at a dose of several e15 cm$^{-2}$ with the photoresist 41 and the gate electrode 7 used as a mask, to form the body region 11 and the source/drain regions 28 in the silicon layer 4 (FIG. 14). Subsequently, after removing the photoresist 41, formed is a photoresist 43 having an opening pattern above regions in which the body region 12 and the source/drain regions 27 are to be formed. After that, an impurity 44 such as boron fluoride (BF$_2$) is ion-implanted at an energy of several tens keV at a dose of several e15 cm$^{-2}$ with the photoresist 43 and the gate electrode 7 used as a mask, to form the body region 12 and the source/drain regions 27 in the silicon layer 4 (FIG. 15).

Next, after removing the photoresist 43, an upper surface of the gate electrode 7, upper surfaces of the source/drain regions 27 and 28 and an upper surface of the body region 11 are silicified to form a cobalt silicide layer (not shown). Then, after entirely depositing a silicon oxide film having a thickness of about 10000 angstroms by the CVD method, the silicon oxide film is polished by the CMP method to be removed by about 5000 angstroms and its surface is thereby planarized, to form the interlayer insulating film 13. After that, the interlayer insulating film 13 is selectively opened to form the contact holes 14, 16 and 18, and conductive plugs are thereafter buried in the contact holes. Then, the wires 15, 17 and 19 made of aluminum, polysilicon or the like are selectively formed on the interlayer insulating film 13 (FIG. 16).

Next, after entirely depositing a silicon oxide film by the CVD method, its surface is planarized to form the interlayer insulating film 20. After that, a contact hole filled with a conductive plug therein is selectively formed in the interlayer insulating film 20 and further the power supply line 21 and the ground line 22 made of aluminum, polysilicon or the like are selectively formed on the interlayer insulating film 20, to obtain the structure of FIG. 2.

Thus, in the semiconductor device of the first preferred embodiment, the isolation insulating film 5 having the complete isolation portion 23, i.e., the complete-isolation insulating film, instead of the body region 11 or the silicon portion of the silicon layer 4, is formed below the power supply line 21. For this reason, even if variation in potential of the power supply line 21 is caused by some external noise, no variation in potential of the body region 11 is caused by capacitive coupling. Therefore, even if the operating frequency of the semiconductor device is high, it is possible to appropriately prevent malfunction caused by the variation in potential of the body region 11.

The Second Preferred Embodiment

FIG. 17 is a plan view showing a structure of a semiconductor device in accordance with the second preferred embodiment of the present invention, and FIG. 18 is a cross section showing a cross-sectional structure of the semiconductor device of FIG. 17 taken along the line L2. In FIG. 17, the interlayer insulating films 13 and 20 and the sidewall 8 are not shown, for convenience of illustration. As shown in FIGS. 17 and 18, the semiconductor device of the second preferred embodiment has a basic structure of the semiconductor device of the first preferred embodiment shown in FIGS. 1 and 2 and is provided with a complete isolation portion 51 below the ground line 22, instead of the complete isolation portion 23 below the power supply line 21. The complete isolation portion 51 of FIG. 18 is formed in a complete isolation region 50 of FIG. 17. The structure of the semiconductor device of the second preferred embodiment other than the above is the same as that of semiconductor device of the first preferred embodiment.

The semiconductor device of the second preferred embodiment can be formed basically through the method of manufacturing the semiconductor device in accordance with the first preferred embodiment shown in FIGS. 3 to 16 step by step and by changing the mask pattern of the photomask used in the step of FIG. 6. For example, after entirely applying a positive-type photoresist, the photoresist is exposed by using a photomask having a mask pattern with an opening portion above a region in which the complete isolation portion 51 is to be formed and then the photoresist in the exposed portion is removed by dissolution with a developer. The photoresist 34 having an opening pattern above the region in which the complete isolation portion 51 is to be formed is thereby formed.

Thus, in the semiconductor device of the second preferred embodiment, the isolation insulating film 5 having the complete isolation portion 51, i.e., the complete-isolation insulating film, instead of the body region 12 or the silicon portion of the silicon layer 4, is formed below the ground line 22. For this reason, even if variation in potential of the ground line 22 is caused by some external noise, no variation in potential of the body region 12 is caused by capacitive coupling. Therefore, even if the operating frequency of the semiconductor device is high, it is possible to appropriately prevent malfunction caused by the variation in potential of the body region 12.

The Third Preferred Embodiment

Figure 20:
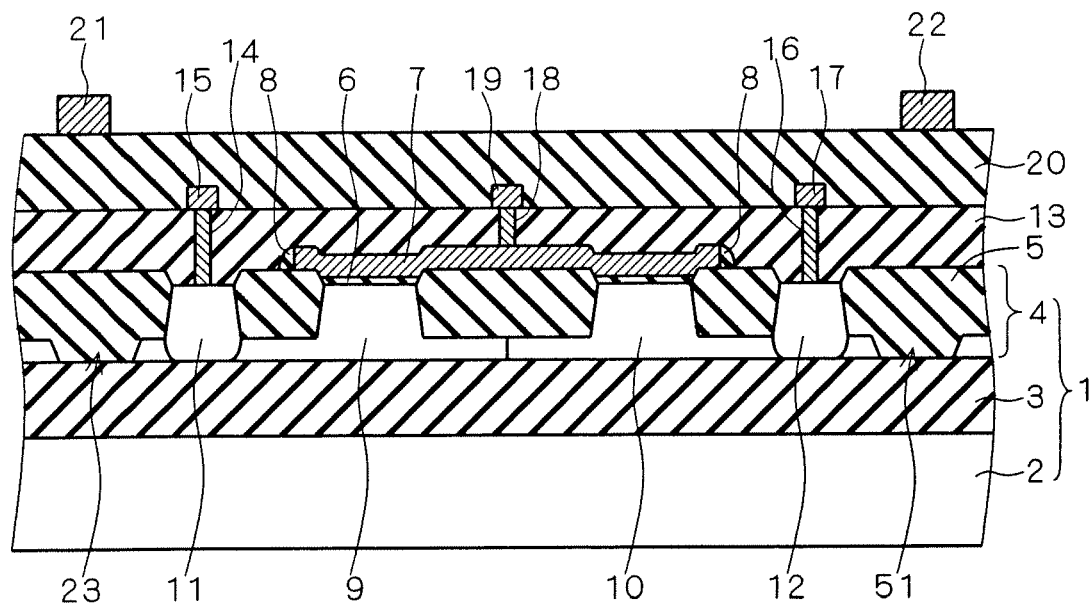
FIG. 20 is a cross section showing a cross-sectional structure of the semiconductor device of FIG. 19.

FIG. 19 is a plan view showing a structure of a semiconductor device in accordance with the third preferred embodiment of the present invention, and FIG. 20 is a cross section showing a cross-sectional structure of the semiconductor device of FIG. 19 taken along the line L3. In FIG. 19, the interlayer insulating films 13 and 20 and the sidewall 8 are not shown, for convenience of illustration. As shown in FIGS. 19 and 20, the semiconductor device of the third preferred embodiment has a basic structure of the semiconductor device of the first preferred embodiment shown in FIGS. 1 and 2 and is provided with the complete isolation portion 51 below the ground line 22 like in the semiconductor device of the second preferred embodiment, together with the complete isolation portion 23 below the power supply line 21. The structure of the semiconductor device of the third preferred embodiment other than the above is the same as that of semiconductor devices of the first and second preferred embodiments.

The semiconductor device of the third preferred embodiment can be formed basically through the method of manufacturing the semiconductor device in accordance with the first preferred embodiment shown in FIGS. 3 to 16 step by step and by changing the mask pattern of the photomask used in the step of FIG. 6. For example, after entirely applying a positive-type photoresist, the photoresist is exposed by using a photomask having a mask pattern with opening portions above regions in which the complete isolation portions 23 and 51 are to be formed, and then the photoresist in the exposed portion is removed by dissolution with a developer. The photoresist 34 having opening patterns above the regions in which the complete isolation portions 23 and 51 are to be formed is thereby formed.

Thus, in the semiconductor device of the third preferred embodiment, the isolation insulating film 5 having the complete isolation portions 23 and 51, i.e., the complete-isolation insulating film, instead of the body regions 11 and 12 or the silicon portion of the silicon layer 4, is formed below the power supply line 21 and the ground line 22. For this reason, even if variation in potential of the power supply line 21 and the ground line 22 is caused by some external noise, no variation in potential of the body regions 11 and 12 is caused by capacitive coupling. Therefore, even if the operating frequency of the semiconductor device is high, it is possible to appropriately prevent malfunction caused by the variation in potential of the body regions 11 and 12.

The Fourth Preferred Embodiment

Figure 21:
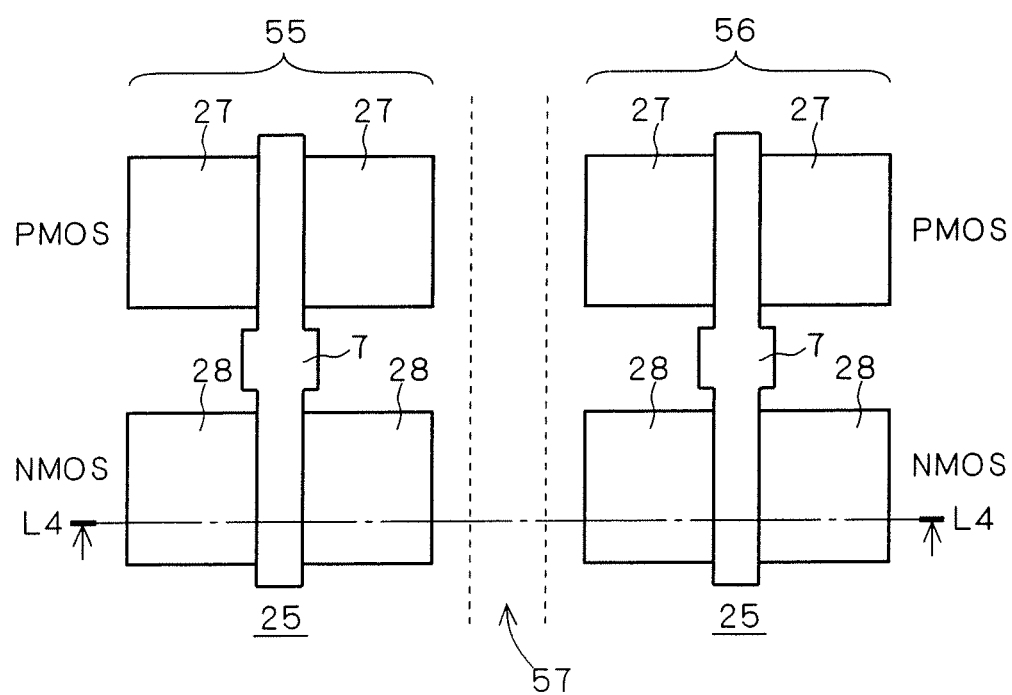
FIG. 21 is a plan view showing a structure of a semiconductor device in accordance with a fourth preferred embodiment of the present invention.
Figure 22:
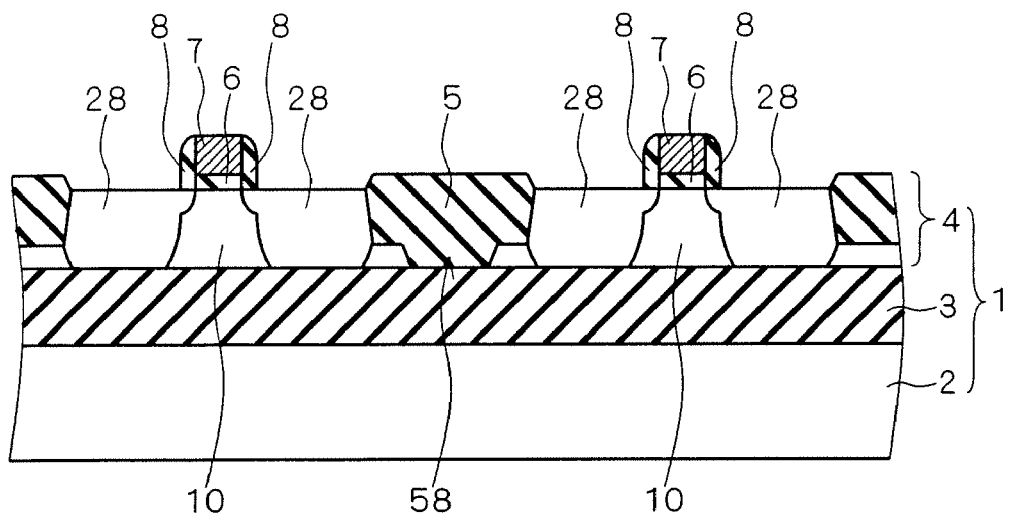
FIG. 22 is a cross section showing a cross-sectional structure of the semiconductor device of FIG. 21.

FIG. 21 is a plan view showing a structure of a semiconductor device in accordance with the fourth preferred embodiment of the present invention, and FIG. 22 is a cross section showing a cross-sectional structure of the semiconductor device of FIG. 21 taken along the line L4. In FIG. 21, the sidewall 8 is not shown, for convenience of illustration. As shown in FIGS. 21 and 22, the semiconductor device of the fourth preferred embodiment comprises two CMOSs 55 and 56 formed adjacently to each other with the isolation insulating film 5 having a complete isolation portion 58 interposed therebetween. The complete isolation portion 58 of FIG. 22 is formed in a complete isolation region 57 of FIG. 21. The operating threshold voltage of the CMOS 55 is lower than that of the CMOS 56 and the calorific value of the CMOS 55 is larger than that of the CMOS 56 when the CMOSs 55 and 56 operate.

The complete isolation portion 58 of the isolation insulating film 5 can be formed through the same method as that of manufacturing the semiconductor device in accordance with the first preferred embodiment shown in FIG. 6. For example, after entirely applying a positive-type photoresist, the photoresist is exposed by using a photomask having a mask pattern with an opening portion above a region in which the complete isolation portion 58 is to be formed, and then the photoresist in the exposed portion is removed by dissolution with a developer. The photoresist 34 having an opening pattern above the region in which the complete isolation portion 58 is to be formed is thereby formed.

Furthermore, the invention of the fourth preferred embodiment can be combined with the inventions of the above first to third preferred embodiments for application.

Thus, in the semiconductor device of the fourth preferred embodiment, where the two CMOSs 55 and 56 having different operating threshold voltages are formed adjacently to each other, the isolation insulating film 5 having the complete isolation portion 58, i.e., the complete-isolation insulating film, instead of the partial-isolation insulating film, is formed between the two CMOSs 55 and 56. Therefore, since it is possible to suppress conduction of the heat generated in the CMOS 55 to the CMOS 56, unstable operation of the CMOS 56 due to the heat can be appropriately prevented.

The Fifth Preferred Embodiment

Figure 23:
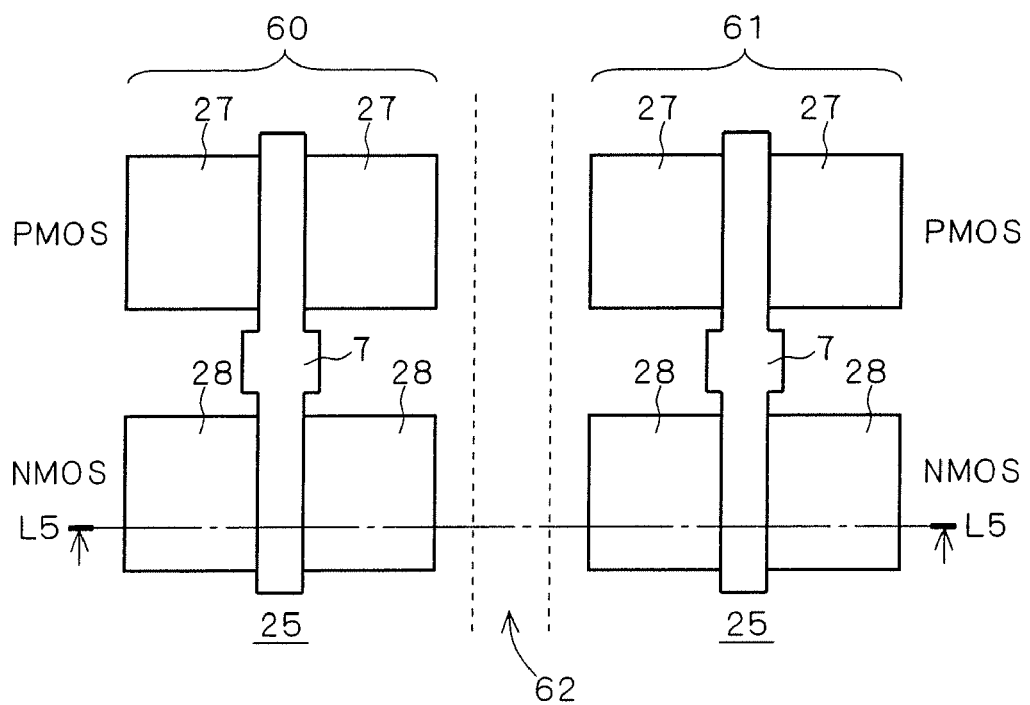
FIG. 23 is a plan view showing a structure of a semiconductor device in accordance with a fifth preferred embodiment of the present invention.
Figure 24:
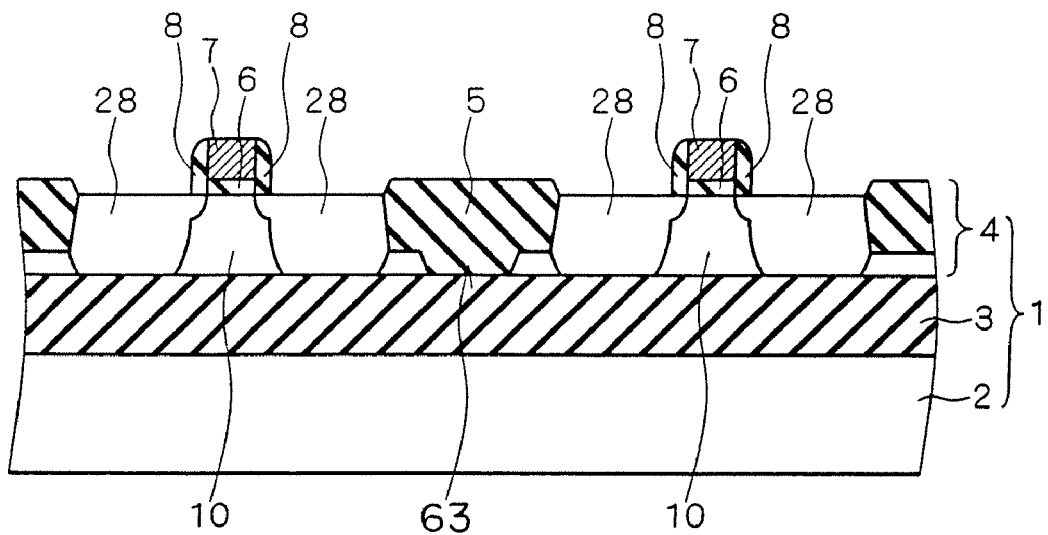
FIG. 24 is a cross section showing a cross-sectional structure of the semiconductor device of FIG. 23.

FIG. 23 is a plan view showing a structure of a semiconductor device in accordance with the fifth preferred embodiment of the present invention, and FIG. 24 is a cross section showing a cross-sectional structure of the semiconductor device of FIG. 23 taken along the line L5. In FIG. 23, the sidewall 8 is not shown, for convenience of illustration. As shown in FIGS. 23 and 24, the semiconductor device of the fifth preferred embodiment comprises two CMOSs 60 and 61 formed adjacently to each other with the isolation insulating film 5 having a complete isolation portion 63 interposed therebetween. The complete isolation portion 63 of FIG. 24 is formed in a complete isolation region 62 of FIG. 23. The CMOSs 60 and 61 have different operating frequencies, and the operating frequency of the CMOS 60 is higher than that of the CMOS 61.

The complete isolation portion 63 of the isolation insulating film 5 can be formed through the same method as that of manufacturing the semiconductor device in accordance with the first preferred embodiment shown in FIG. 6. For example, after entirely applying a positive-type photoresist, the photoresist is exposed by using a photomask having a mask pattern with an opening portion above a region in which the complete isolation portion 63 is to be formed, and then the photoresist in the exposed portion is removed by dissolution with a developer. The photoresist 34 having an opening pattern above the region in which the complete isolation portion 63 is to be formed is thereby formed.

Furthermore, the invention of the fifth preferred embodiment can be combined with the inventions of the above first to third preferred embodiments for application.

Thus, in the semiconductor device of the fifth preferred embodiment, where the two CMOSs 60 and 61 having different operating frequencies are formed adjacently to each other, the isolation insulating film 5 having the complete isolation portion 63, i.e., the complete-isolation insulating film, instead of the partial-isolation insulating film, is formed between the two CMOSs 60 and 61.

The variation in body potential of the CMOS 60 having a high operating frequency is large while the variation in body potential of the CMOS 61 having a low operating frequency is small. Therefore, if the partial-isolation insulating film is formed between the CMOSs 60 and 61, the body potentials of the CMOSs 60 and 61 affect each other through the silicon layer 4 between the partial-isolation insulating film 5 and the insulating film 3. As a result, subtle variation in characteristics caused by mutual effect of the body potentials largely affects the characteristics of the circuit itself in a circuit whose operation sensitively depends on magnitude of current such as an analog circuit and an RF circuit. In contrast, the semiconductor device of the fifth preferred embodiment, in which the complete-isolation insulating film is formed between the CMOSs 60 and 61, can appropriately prevent the body potentials of the CMOSs 60 and 61 from affecting each other.

The Sixth Preferred Embodiment

Figure 25:
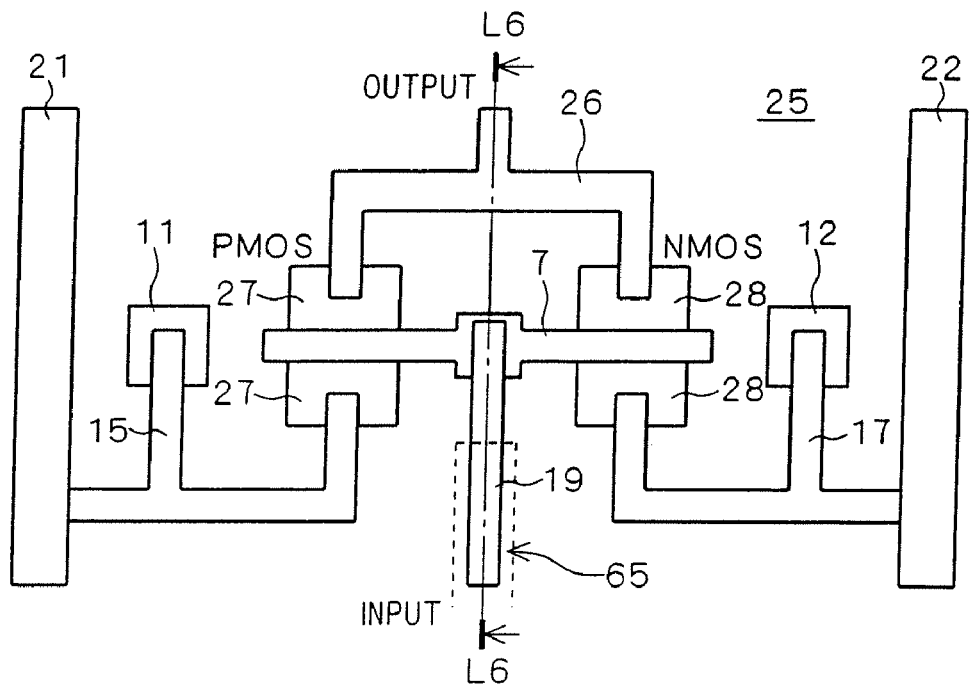
FIG. 25 is a plan view showing a structure of a semiconductor device in accordance with a sixth preferred embodiment of the present invention.

FIG. 25 is a plan view showing a structure of a semiconductor device in accordance with the sixth preferred embodiment of the present invention, and FIG. 26 is a cross section showing a cross-sectional structure of the semiconductor device of FIG. 25 taken along the line L6. In FIG. 25, the interlayer insulating films 13 and 20 and the sidewall 8 are not shown, for convenience of illustration. As shown in FIGS. 25 and 26, the semiconductor device of the sixth preferred embodiment has a basic structure of the semiconductor device of the first preferred embodiment shown in FIGS. 1 and 2 and is provided with a complete isolation portion 66 below the wire 19 serving as a signal input line of the CMOS, instead of the complete isolation portion 23 below the power supply line 21. Further, the complete isolation portion 23 of FIG. 1 and the complete isolation portion 51 of FIG. 17 may be formed together with the complete isolation portion 66. The complete isolation portion 66 of FIG. 26 is formed in a complete isolation region 65 of FIG. 25. The structure of the semiconductor device of the sixth preferred embodiment other than the above is the same as that of semiconductor device of the first preferred embodiment.

The semiconductor device of the sixth preferred embodiment can be formed basically through the method of manufacturing the semiconductor device in accordance with the first preferred embodiment shown in FIGS. 3 to 16 step by step and by changing the mask pattern of the photomask used in the step of FIG. 6. For example, after entirely applying a positive-type photoresist, the photoresist is exposed by using a photomask having a mask pattern with an opening portion above a region in which the complete isolation portion 66 is to be formed, and then the photoresist in the exposed portion is removed by dissolution with a developer. The photoresist 34 having an opening pattern above the region in which the complete isolation portion 66 is to be formed is thereby formed.

Thus, in the semiconductor device of the sixth preferred embodiment, the isolation insulating film 5 having the complete isolation portion 66, i.e., the complete-isolation insulating film below the wire 19. Therefore, even if there arises fluctuation in an input signal which is inputted to the CMOS, it is possible to suppress variation in body potential due to the fluctuation. Therefore, since it is possible to suppress variation in drain current Id caused by the variation in body potential in a region where linearity of the drain current Id is needed especially in the analog circuit and the RF circuit, improvement in circuit characteristics can be ensured.

Furthermore, though FIGS. 25 and 26 shows the semiconductor device in which the gate electrode 7 made of polysilicon and the wire 19 for input made of aluminum are connected to each other through the contact hole 18, the semiconductor device in which the gate electrode 7 and the wire 19 for input both of which are made of polysilicon are formed as a unit may produce the same effect as above by forming the complete-isolation insulating film below the wire 19.

The Seventh Preferred Embodiment

The seventh preferred embodiment proposes an automatic formation of a mask pattern of a photomask used in formation of the complete isolation portion in the method of manufacturing the semiconductor device of the above first to third and sixth preferred embodiments or the tenth to twelfth preferred embodiments discussed later, in which the complete isolation portion of the isolation insulating film is formed below the wire.

FIGS. 27(A) and 27(B), 28 and 29 are conceptional diagrams showing a method of forming a mask pattern in accordance with the seventh preferred embodiment of the present invention. As shown in FIG. 27(A), in a wiring layout 70 made in a design stage, a wire formation region 71 and a wire non-formation region 72 are represented by binary logic values "1" and "0", respectively. In the seventh preferred embodiment, with reference to the wiring layout 70, a mask pattern of a photomask is automatically formed. Specific discussion will be made below, taking a case of formation of a positive-type photoresist as an example.

First, the logic represented in the wiring layout 70 is inverted to generate a design layout (not shown) for formation of a mask pattern. In the design layout thus generated, an opening portion of the mask pattern and a non-opening portion are represented by binary logic values "0" and "1", respectively. Then, on the basis of this design layout, a photomask is formed. As shown in FIG. 27(B), a formed photomask 73 has an opening portion 74 corresponding to the wire formation region 71 of the wiring layout 70 and a non-opening portion 75 corresponding to the wire non-formation region 72.

Discussion will be made below on a method of applying the above automatic formation of a mask pattern to the method of manufacturing the semiconductor device in accordance with the present invention. FIG. 28 shows a CMOS layout 76 corresponding to the semiconductor device of the above first to third and sixth preferred embodiments. First, in the CMOS layout 76, a forbidden region 77 where formation of the complete isolation portion is forbidden is specified. Specifically, the periphery of a CMOS formation region including the source/drain regions 27 and 28 and the body regions 11 and 12 is specified as the forbidden region 77.

Next, with reference to the wiring layout on the power supply line 21, the ground line 22 and the wires 19 and 26 and the CMOS layout 76 in which the forbidden region 77 is specified, the above automatic formation of a mask pattern is applied to a region other than the forbidden region 77, to form a photomask used in exposing the photoresist in the step of FIG. 6. After that, an isolation insulating film having a complete isolation portion and a partial isolation portion is formed through the method of the first preferred embodiment. FIG. 29 shows only a portion in which complete isolation portion is formed among an isolation pattern 78 of the isolation insulating film thus formed, as a complete isolation region 79. It can be seen from FIG. 29 that in the region other than the forbidden region 77 in the CMOS layout 76, the complete isolation regions 79 are formed below the power supply line 21, the ground line 22 and the wires 19 and 26.

In the above discussion, since the design layout is generated only by inverting the logic represented in the wiring layout 70, the width of the complete isolation portion is equal to that of the wire. Herein, discussion will be made on a method of forming a complete isolation portion whose width is larger than that of the wire on the basis of the above automatic formation of the mask pattern.

FIGS. 30(A) to (C) and 31 are conceptional diagrams showing another method of forming a mask pattern in accordance with the seventh preferred embodiment of the present invention. As shown in FIG. 30(A), in the wiring layout 70, the wire formation region 71 having a width W1 is represented. In generating the design layout, assuming that the width of the wire formation region 71 is W2 (>W1) (in other words, the wire width is oversized), the logic of the wiring layout 70 is inverted. As shown in FIG. 30(B), in a design layout 81 thus generated, an opening portion 82 having the width W2 and other portion, i.e., a not-opening portion 83 are represented. Then, a photomask is formed on the basis of the design layout 81. As shown in FIG. 30(C), a formed photomask 84 has an opening portion 85 having the width W2 corresponding to the opening portion 82 of the design layout 81 and a not-opening portion 86 corresponding to the not-opening portion 83 of the design layout 81.

Figure 31:
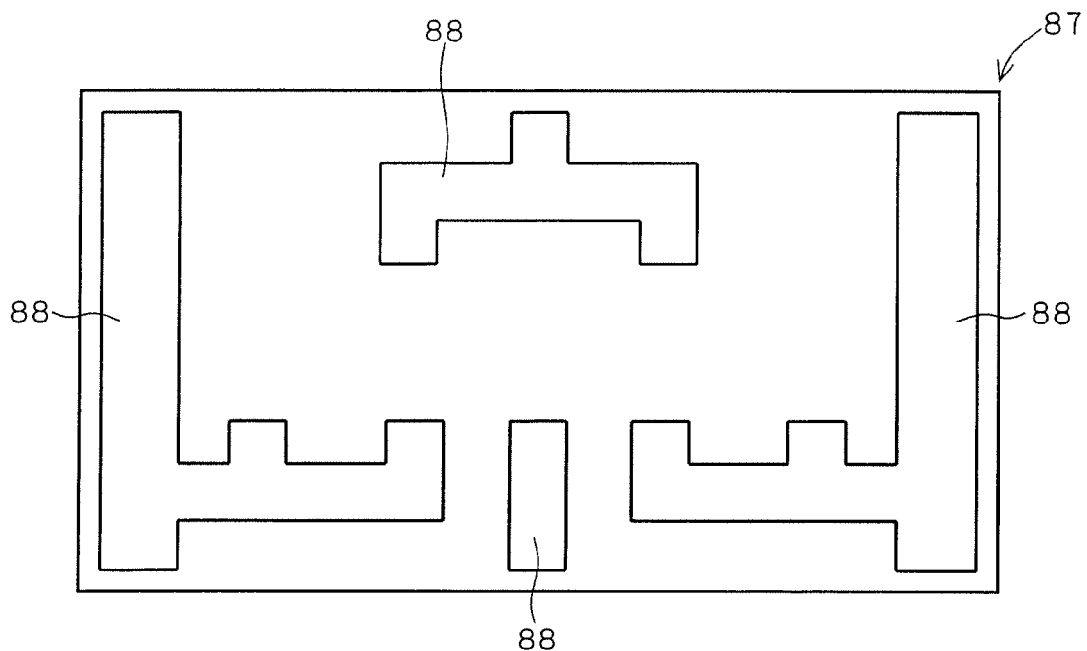

FIG. 31 shows a result of application of the above method of forming the mask pattern to the method of manufacturing the semiconductor device in accordance with the present invention. In comparison between the isolation pattern 87 of FIG. 31 and the isolation pattern 78 of FIG. 29, the width of a complete isolation region 88 of the isolation pattern 87 is larger than that of the complete isolation region 79 of the isolation pattern 78.

Furthermore, in forming the design layout, by using an undersized wire width, the width of the complete isolation portion can be set smaller than the actual width of the wire.

Thus, the method of forming the mask pattern in accordance with the seventh preferred embodiment allows easy formation of a mask pattern of a photomask used in forming the complete isolation portion with reference to the wiring layout in the method of manufacturing the semiconductor device in which the complete isolation portion of the isolation insulating film is formed below the wire.

The Eighth Preferred Embodiment

Figure 32:
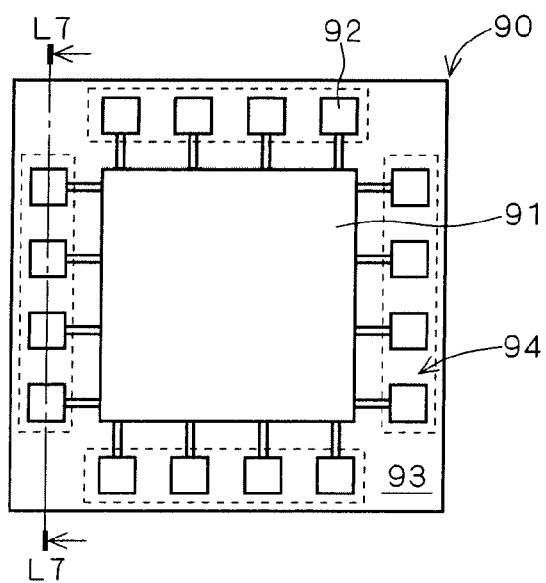
FIG. 32 is a plan view showing a structure of a semiconductor device in accordance with an eighth preferred embodiment of the present invention.
Figure 33:
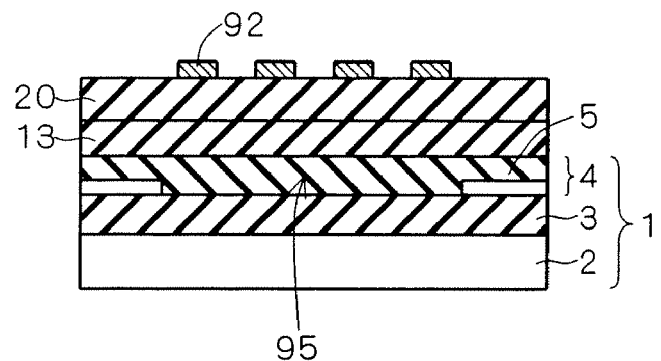
FIG. 33 is a cross section showing a cross-sectional structure of the semiconductor device of FIG. 32.

FIG. 32 is a plan view showing a structure of a semiconductor device in accordance with the eighth preferred embodiment of the present invention, and FIG. 33 is a cross section showing a cross-sectional structure of the semiconductor device of FIG. 32 taken along the line L7. In the center portion of an IC chip 90, the semiconductor device of the above first to sixth preferred embodiments is incorporated as an LSI 91. Further, in the peripheral portion of the IC chip 90, a plurality of bonding pads 92 each made of aluminum or the like are arranged to electrically connect the LSI 91 and outer elements. The bonding pad 92 is formed on the isolation insulating film 20. Furthermore, the semiconductor device of the eighth preferred embodiment comprises the isolation insulating film 5 having a complete isolation portion 95 which is so formed as to extend from the upper surface of the silicon layer 4 and reach the upper surface of insulating film 3 below a region in which the bonding pads 92 are formed. The complete isolation portion 95 of FIG. 33 is formed in a complete isolation region 94 of FIG. 32.

The semiconductor device of the eighth preferred embodiment can be formed basically through the method of manufacturing the semiconductor device in accordance with the first preferred embodiment shown in FIGS. 3 to 16 step by step and by changing the mask pattern of the photomask used in the step of FIG. 6. For example, after entirely applying a positive-type photoresist, the photoresist is exposed by using a photomask having a mask pattern with an opening portion above a region in which the complete isolation portion 95 is to be formed, and then the photoresist in the exposed portion is removed by dissolution with a developer. The photoresist 34 having an opening pattern above the region in which the complete isolation portion 95 is to be formed is thereby formed.

Thus, in the semiconductor device of the eighth preferred embodiment, the isolation insulating film 5 having the complete isolation portion 95, i.e., the complete-isolation insulating film is formed below the bonding pads 92. For this reason, even if some noise is propagated from the outer elements through the bonding pads 92 to the IC chip 90, it is possible to appropriately prevent variation in body potential caused by the noise. As a result, the linearity in the analog circuit and the RF circuit can be improved.

The Ninth Preferred Embodiment

Figure 34:
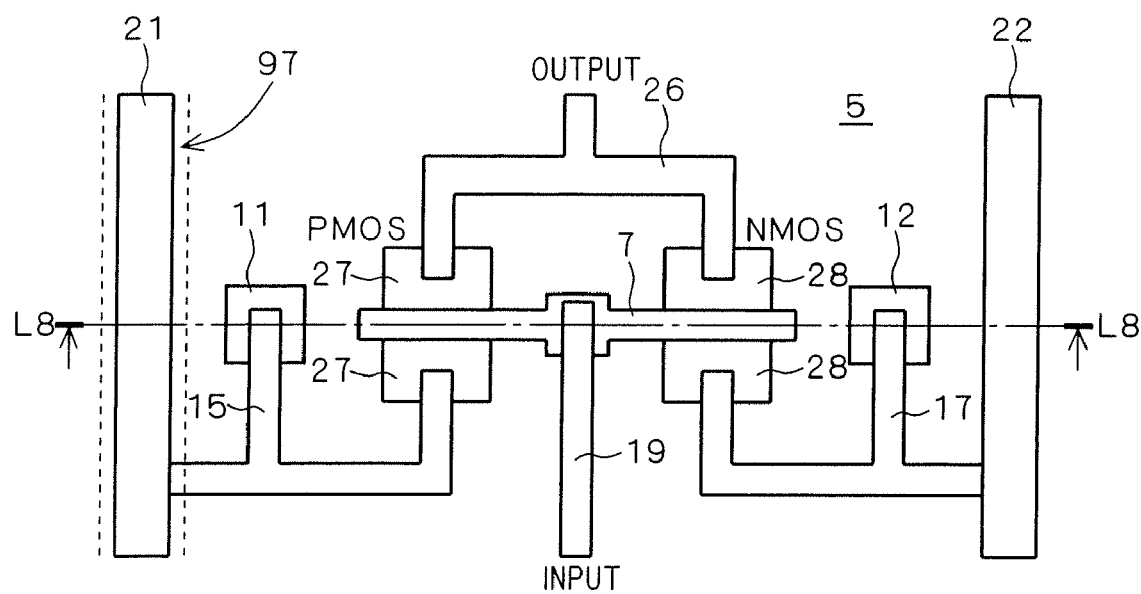
FIG. 34 is a plan view showing a structure of a semiconductor device in accordance with a ninth preferred embodiment of the present invention.
Figure 35:
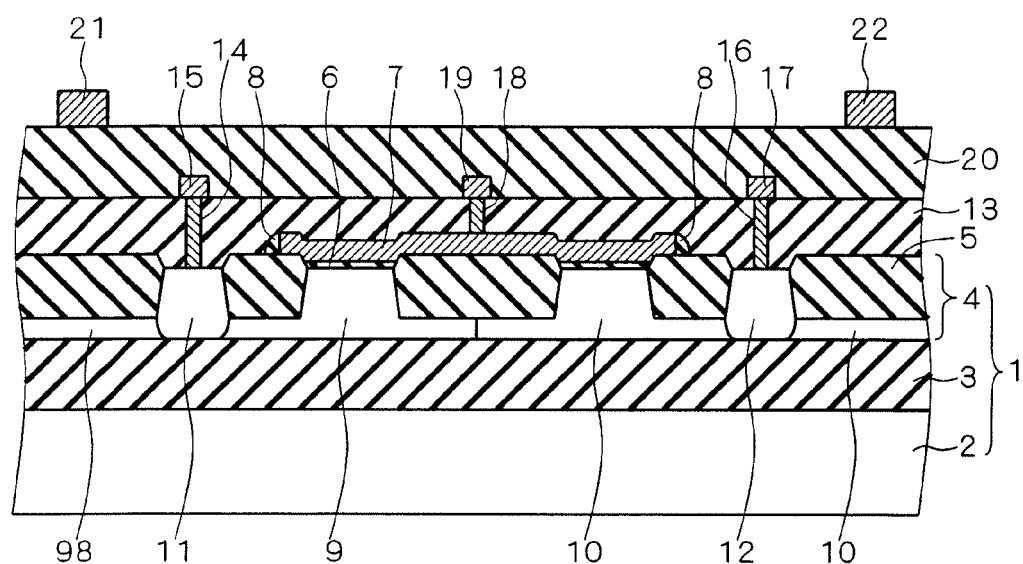
FIG. 35 is a cross section showing a cross-sectional structure of the semiconductor device of FIG. 34.

FIG. 34 is a plan view showing a structure of a semiconductor device in accordance with the ninth preferred embodiment of the present invention, and FIG. 35 is a cross section showing a cross-sectional structure of the semiconductor device of FIG. 34 taken along the line L8. In FIG. 34, the interlayer insulating films 13 and 20 and the sidewall 8 are not shown, for convenience of illustration. As shown in FIGS. 34 and 35, the semiconductor device of the ninth preferred embodiment has a basic structure of the semiconductor device of the first preferred embodiment shown in FIGS. 1 and 2 and is provided with an $n^-$-type low-concentration impurity region 98, instead of the complete isolation portion 23. The low-concentration impurity region 98 is formed in the silicon layer 4 between a bottom surface of the isolation insulating film 5 of partial-trench type and the upper surface of the insulating film 3 below the power supply line 21. The low-concentration impurity region 98 of FIG. 35 is formed in a high-resistance region 97 of FIG. 34. The structure of the semiconductor device of the ninth preferred embodiment other than the above is the same as that of semiconductor device of the first preferred embodiment.

Furthermore, though a case where the invention of the ninth preferred embodiment is applied to the basic semiconductor device of the first preferred embodiment shown in FIGS. 1 and 2 has been discussed above, application is not limited to this case and there may be a case where the invention of the ninth preferred embodiment is applied to the basic semiconductor device of the second or third preferred embodiments. In this case, it is only necessary to form a $p^-$-type low-concentration impurity region, instead of the complete isolation portion 51, in the silicon layer 4 between the bottom surface of the isolation insulating film 5 of partial-trench type and the upper surface of the insulating film 3 below the ground line 22.

Thus, in the semiconductor device of the ninth preferred embodiment, the $n^-$-type low-concentration impurity region 98 is formed below the power supply line 21. The low-concentration impurity region 98, with a resistance higher than that of the impurity introduction region 10, for example, is close to an insulator in characteristics. For this reason, even if the potential of the power supply line 21 varies due to the effect of some external noise, capacitive coupling is hard to occur between the low-concentration impurity region 98 and the power supply line 21. Therefore, it is possible to suppress variation in potential of the body region 11 caused by the variation in potential of the power supply line 21, and as a result, the linearity in the analog circuit and the RF circuit can be improved.

The Tenth Preferred Embodiment

Figure 36:
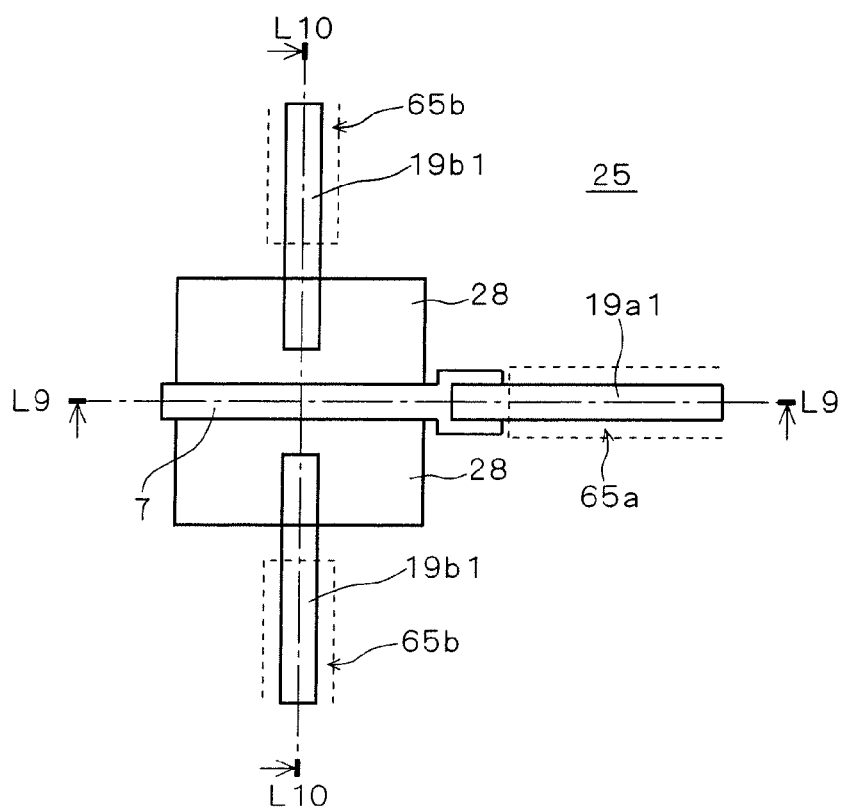
FIG. 36 is a plan view showing a structure of a semiconductor device in accordance with a tenth preferred embodiment of the present invention.
Figure 37:
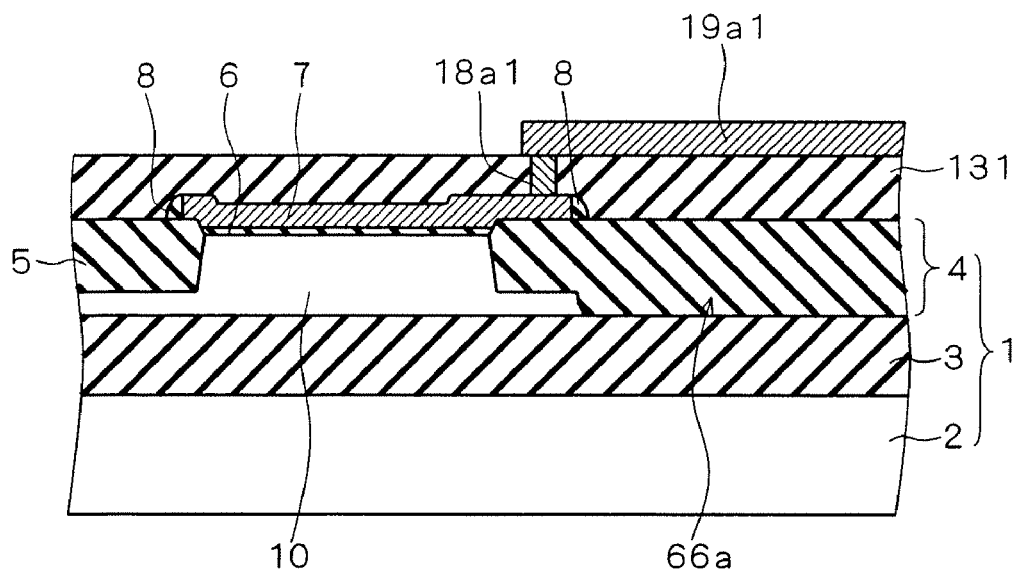
FIGS. 37 and 38 are cross sections each showing a cross-sectional structure of the semiconductor device of FIG. 36.
Figure 38:
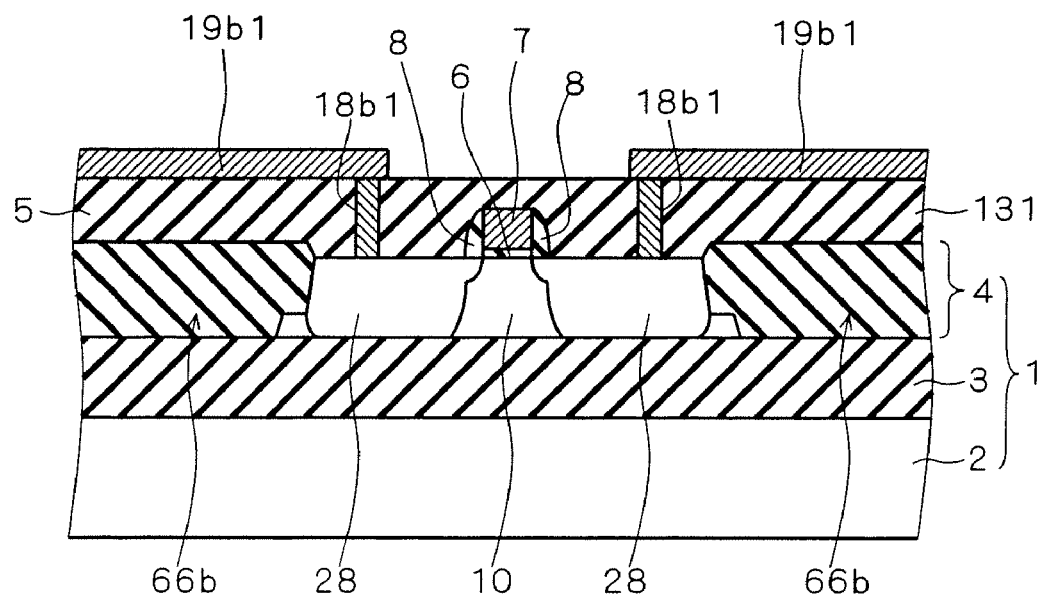

FIG. 36 is a plan view showing a structure of a semiconductor device in accordance with the tenth preferred embodiment of the present invention. FIGS. 37 and 38 are cross sections showing cross-sectional structures of the semiconductor device taken along the lines L9 and L10, respectively, of FIG. 36. In the FIG. 36, for convenience of illustration, an interlayer insulating film 131 and the sidewall 8 are omitted. As shown in FIG. 36, the semiconductor device of the tenth preferred embodiment comprises an NMOS having the gate electrode 7 and the source/drain regions 28. A wire 19a1 is connected to the gate electrode 7 and a wire 19b1 is connected to the source/drain regions 28. The wires connected to the gate electrode 7 and the wires connected to the source/drain regions 28 constitute multilayer interconnection structures, respectively. The wires 19a1 and 19b1 are each a first-layer wire in the lowest layer, which is formed nearest to the SOI substrate 1 among a plurality of wires constituting the multilayer interconnection structure. Further, the wires 19a1 and 19b1 are each made of metal such as aluminum.

Referring to FIG. 37, the interlayer insulating film 131 is formed on the NMOS and the isolation insulating film 5. The wire 19a1 is formed on the interlayer insulating film 131. Further, the wire 19a1 is connected to the gate electrode 7 through a contact hole 18a1 which is selectively formed in the interlayer insulating film 131 and filled with a conductive plug therein. Below the wire 19a1, a complete isolation portion 66a reaching the upper surface of the insulating film 3 is formed in the isolation insulating film 5. In other words, the semiconductor device of FIG. 37 comprises a complete-isolation insulating film extending from the upper surface of the silicon layer 4 to reach the upper surface of the insulating film 3 below the wire 19a1 which is the first-layer wire. The complete isolation portion 66a shown in FIG. 37 is formed in a complete isolation region 65a shown in FIG. 36.

Referring to FIG. 38, the wire 19b1 is formed on the interlayer insulating film 131. Further, the wire 19b1 is connected to the source/drain regions 28 through a contact hole 18b1 which is selectively formed in the interlayer insulating film 131 and filled with a conductive plug therein. Below the wire 19b1, a complete isolation portion 66b reaching the upper surface of the insulating film 3 is formed in the isolation insulating film 5. In other words, the semiconductor device of FIG. 38 comprises a complete-isolation insulating film extending from the upper surface of the silicon layer 4 to reach the upper surface of the insulating film 3 below the wire 19b1 which is the first-layer wire. The complete isolation portion 66b shown in FIG. 38 is formed in a complete isolation region 65b shown in FIG. 36.

Figure 39:
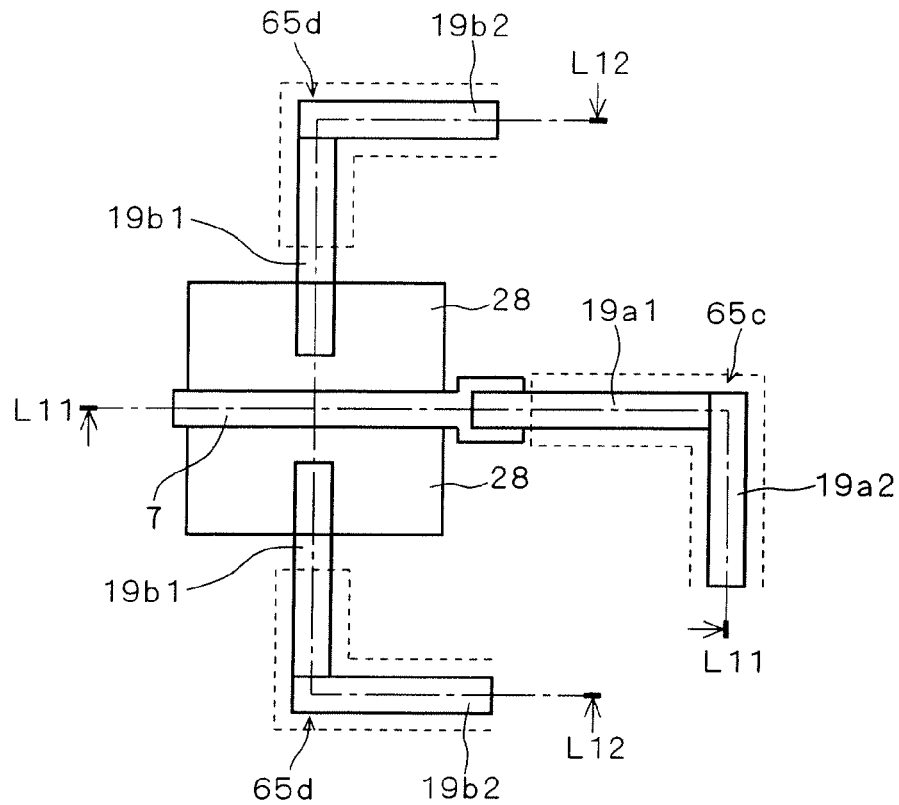
FIG. 39 is a plan view showing another structure of a semiconductor device in accordance with the tenth preferred embodiment of the present invention.
Figure 40:
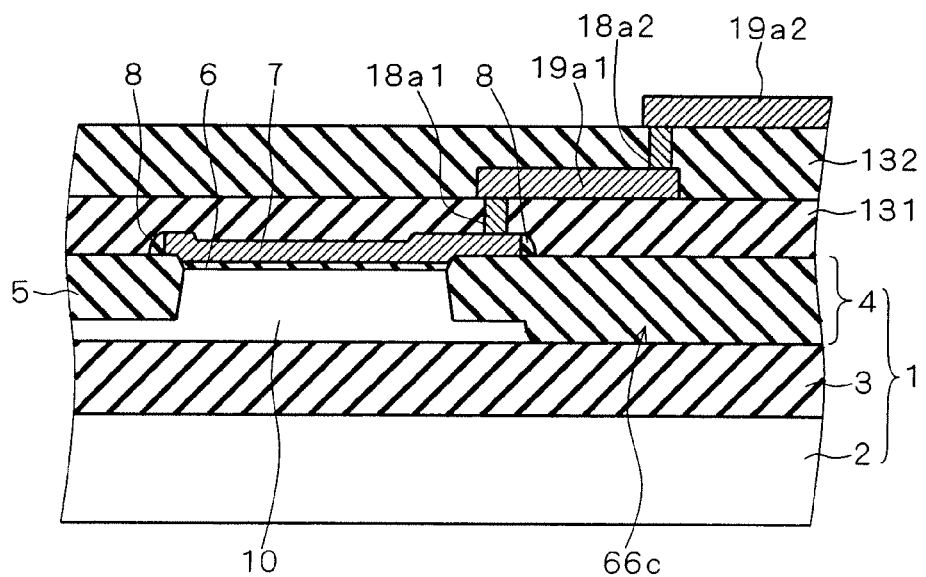
FIGS. 40 and 41 are cross sections each showing a cross-sectional structure of the semiconductor device of FIG. 39.
Figure 41:
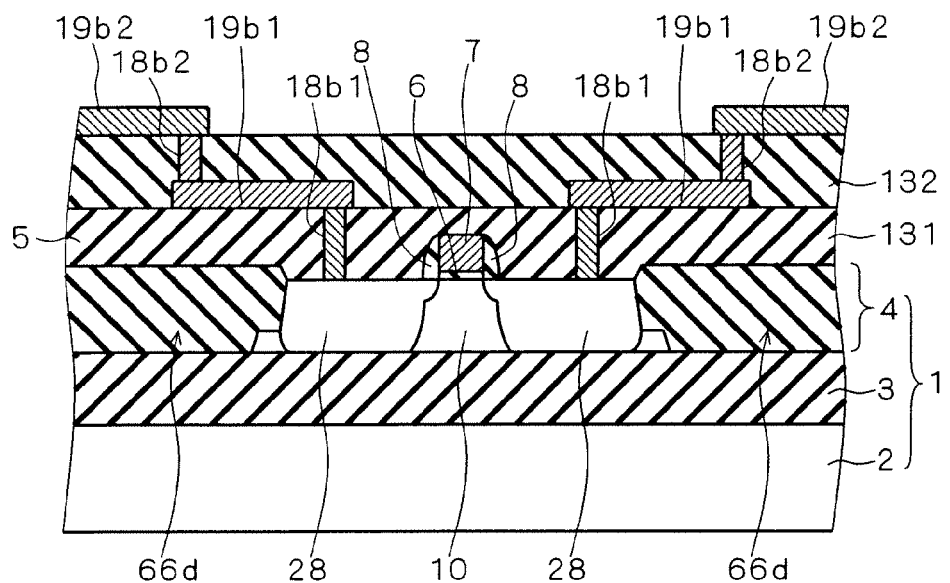

FIG. 39 is a plan view showing another structure of a semiconductor device in accordance with the tenth preferred embodiment of the present invention. FIGS. 40 and 41 are cross sections showing cross-sectional structures of the semiconductor device taken along the lines L11 and L12, respectively, of FIG. 39. In the FIG. 39, for convenience of illustration, interlayer insulating films 131 and 132 and the sidewall 8 are omitted. The semiconductor device of FIG. 39 has a basic structure of the semiconductor device shown in FIG. 36 and further comprises a wire 19a2 connected to the wire 19a1 and a wire 19b2 connected to the wire 19b1. As discussed above, the wires connected to the gate electrode 7 and the wires connected to the source/drain regions 28 constitute multilayer interconnection structures, respectively. The wires 19a2 and 19b2 are second-layer wires in the layers nearest to the SOI substrate 1 but the wires 19a1 and 19a2 which are the first-layer wires, respectively, among a plurality of wires constituting the multilayer interconnection structures. Further, the wires 19a2 and 19b2 are each made of metal such as aluminum.

Referring to FIG. 40, the interlayer insulating film 132 is formed on the wire 19a1 and the interlayer insulating film 131. The wire 19a2 is formed on the interlayer insulating film 132. Further, the wire 19a2 is connected to the wire 19a1 through a contact hole 18a2 which is selectively formed in the interlayer insulating film 132 and filled with a conductive plug therein. Below the wires 19a1 and 19a2, a complete isolation portion 66c reaching the upper surface of the insulating film 3 is formed in the isolation insulating film 5. In other words, the semiconductor device of FIG. 40 comprises a complete-isolation insulating film extending from the upper surface of the silicon layer 4 to reach the upper surface of the insulating film 3 below the wire 19a1 which is the first-layer wire and the wire 19a2 which is the second-layer wire. The complete isolation portion 66c shown in FIG. 40 is formed in a complete isolation region 65c shown in FIG. 39.

Referring to FIG. 41, the interlayer insulating film 132 is formed on the wire 19b1 and the interlayer insulating film 131. The wire 19b2 is formed on the interlayer insulating film 132. Further, the wire 19b2 is connected to the wire 19b1 through a contact hole 18b2 which is selectively formed in the interlayer insulating film 132 and filled with a conductive plug therein. Below the wires 19b1 and 19b2, a complete isolation portion 66d reaching the upper surface of the insulating film 3 is formed in the isolation insulating film 5. In other words, the semiconductor device of FIG. 41 comprises a complete-isolation insulating film extending from the upper surface of the silicon layer 4 to reach the upper surface of the insulating film 3 below the wire 19b1 which is the first-layer wire and the wire 19b2 which is the second-layer wire. The complete isolation portion 66d shown in FIG. 41 is formed in a complete isolation region 65d shown in FIG. 39.

Thus, in the semiconductor device of the tenth preferred embodiment, the isolation insulating film 5 having the complete isolation portions 66a to 66d, i.e., the complete-isolation insulating film, instead of the silicon portion of the silicon layer 4, is formed below the first-layer wire or below the first-layer wire and the second-layer wire. For this reason, even if the potentials of the wires 19a1 and 19b1 or the wires 19a1, 19b1, 19a2 and 19b2 vary due to some external noise, no variation in potential of the body region is caused by capacitive coupling. Therefore, even if the operating frequency of the semiconductor device is high, it is possible to appropriately prevent malfunction caused by the variation in potential of the body region.

In the semiconductor device of the tenth preferred embodiment, particularly, the complete-isolation insulating film is formed below the lower wires (the first-layer wire or the first-layer wire and the second-layer wire) of the multilayer interconnection structure which are likely to affect the potential of the body region. Therefore, a great effect of preventing the malfunction is achieved. Forming the complete-isolation insulating film not only below the lower wires of the multilayer interconnection structure but also below the upper wires is possible and produces a greater effect of preventing the malfunction.

The Eleventh Preferred Embodiment

Figure 42:
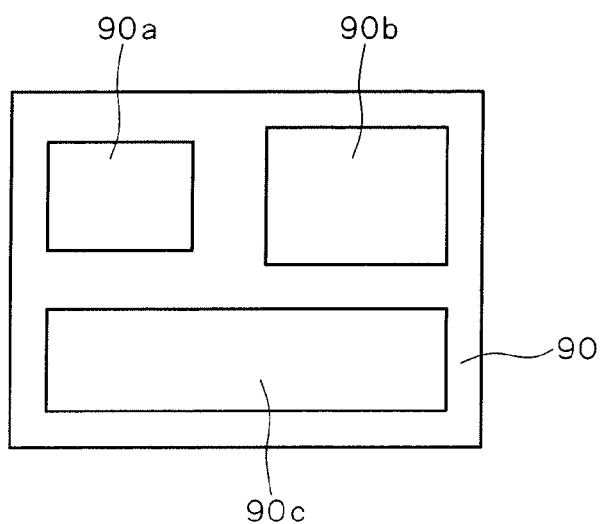
FIG. 42 is a plan view showing a structure of a semiconductor device in accordance with an eleventh preferred embodiment of the present invention.
Figure 47:
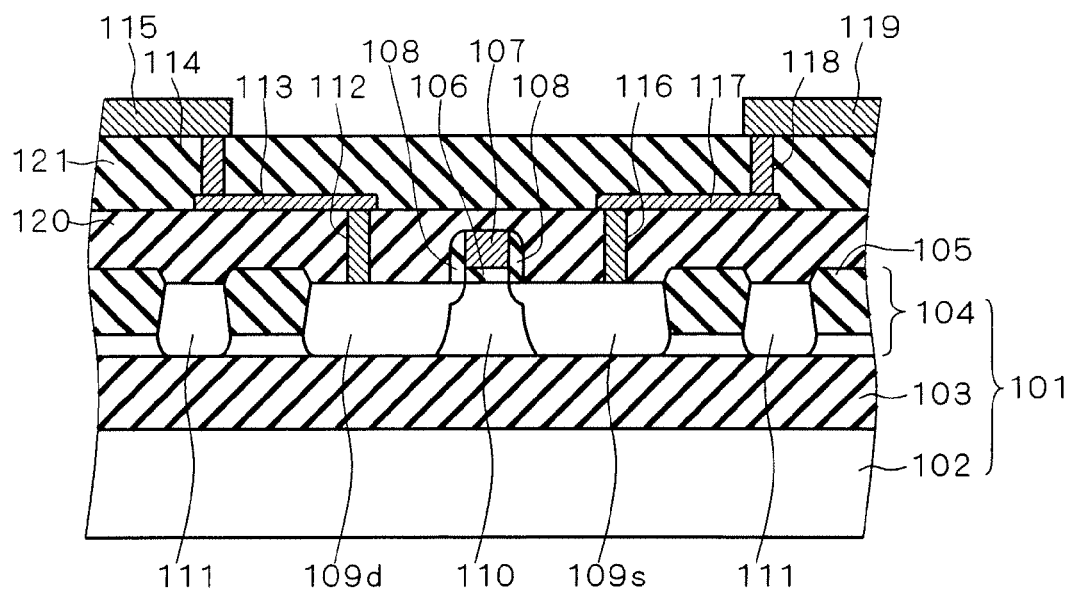
FIG. 47 is a cross section showing a structure of the semiconductor device in accordance with the first background art.
Figure 48:
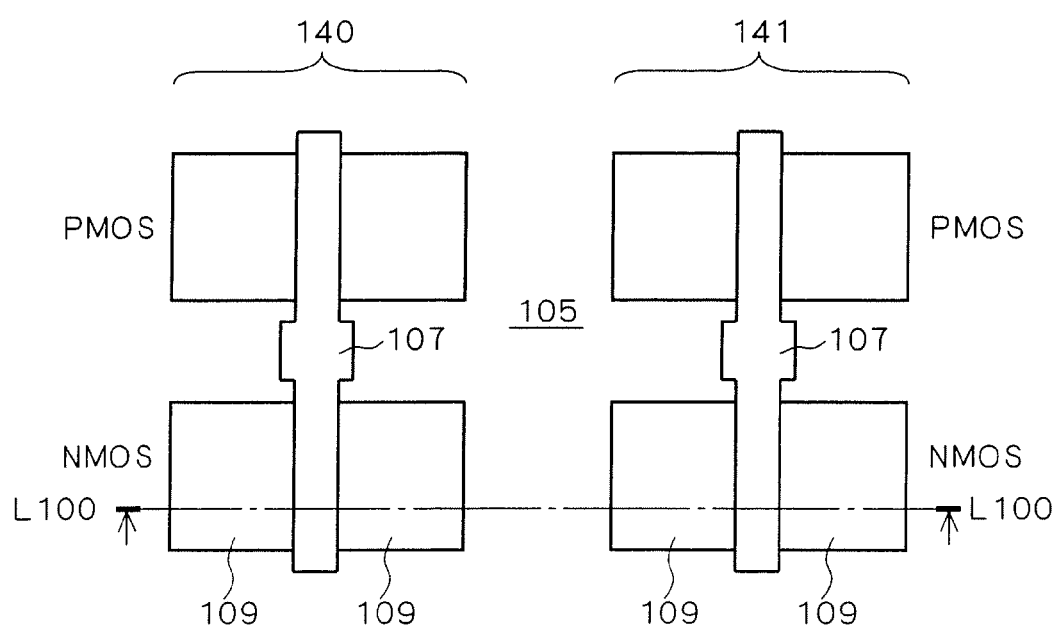
FIG. 48 is a plan view showing a structure of the semiconductor device in accordance with the second background art.
Figure 49:
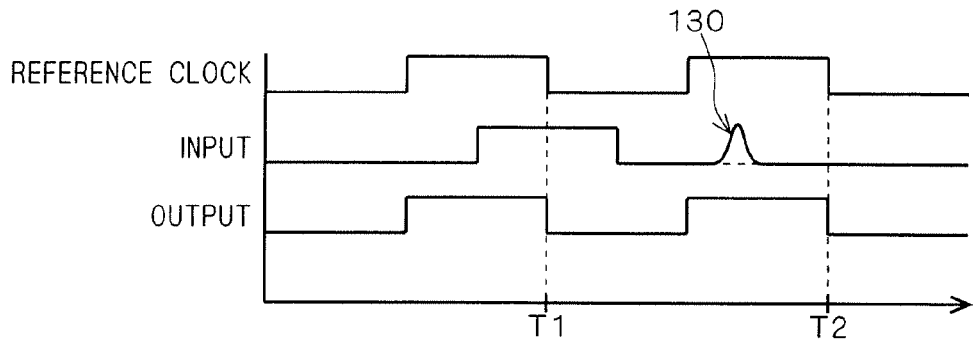
FIGS. 49 and 50 are timing charts used for explaining the problem of the semiconductor device in accordance with the first background art.
Figure 50:
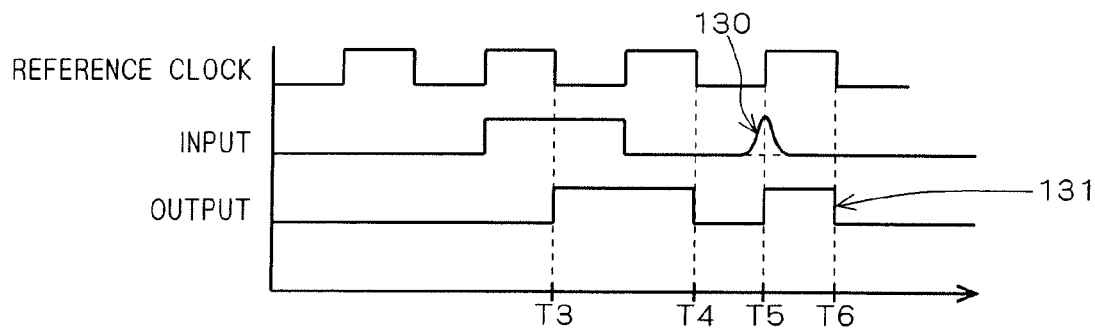
Figure 51:
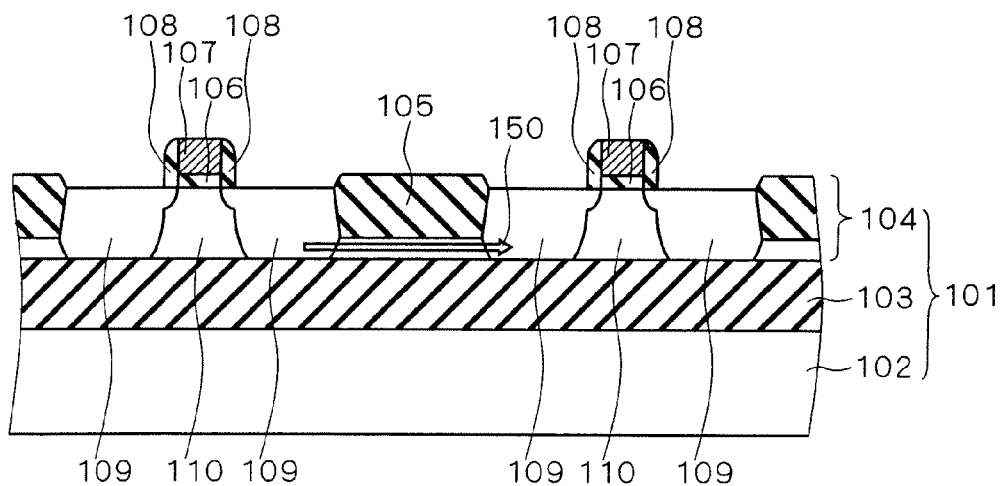
FIG. 51 is a cross section used for explaining the problem of the semiconductor device in accordance with the second background art.

FIG. 42 is a plan view showing a structure of a semiconductor device in accordance with the eleventh preferred embodiment of the present invention. The IC chip 90 comprises a high-speed operation portion 90b incorporating a circuit which operates with a high operating frequency not less than GHz order and a low-speed operation portion 90a and a middle-speed operation portion 90c each incorporating a circuit which operates with an operating frequency less than GHz order. "Operating with a high operating frequency not less than GHz order" is equivalent to that a signal having a frequency not less than GHz order is propagated through the wire 19a1 in FIG. 36, for example.

Among the high-speed operation portion 90b, the low-speed operation portion 90a and the middle-speed operation portion 90c, the invention of the tenth preferred embodiment is applied only to the high-speed operation portion 90b. Specifically, in the high-speed operation portion 90b, the complete-isolation insulating film is formed below the lower wires of the multilayer interconnection structure and in the low-speed operation portion 90a and the middle-speed operation portion 90c, a partial-isolation insulating film is formed below the lower wires of the multilayer interconnection structure. The invention of the tenth preferred embodiment has to be applied to at least the high-speed operation portion 90b, and may be applied to all the high-speed operation portion 90b, the low-speed operation portion 90a and the middle-speed operation portion 90c.

A circuit which operates with a high operating frequency, generally, is more affected by some noise than a circuit which operates with a low operating frequency. In the semiconductor device of the eleventh preferred embodiment, to solve this problem, the complete-isolation insulating film is formed below the lower wires of the multilayer interconnection structure at least in the high-speed operation portion 90b among the high-speed operation portion 90b, the low-speed operation portion 90a and the middle-speed operation portion 90c of the IC chip 90. Therefore, in the semiconductor device of the eleventh preferred embodiment, it is possible to stably operate the circuit in the high-speed operation portion 90b which is likely to be affected by some noise.

FIG. 43 is a plan view showing another structure of a semiconductor device in accordance with the eleventh preferred embodiment of the present invention. The semiconductor device of FIG. 43 has a basic structure of the semiconductor device shown in FIG. 42 and further comprises a complete isolation region 94b surrounding the high-speed operation portion 90b. Alternately, the complete isolation region 94b surrounding the high-speed operation portion 90b may be formed without forming the complete-isolation insulating film below the lower wires of the multilayer interconnection structure in the high-speed operation portion 90b. In the complete isolation region 94b (i.e., the hatched portion in FIG. 43), a complete-isolation insulating film is formed. Thus, by forming the complete-isolation insulating film surrounding the high-speed operation portion 90b, it is possible to avoid the effect of variation in potential of the body region in the high-speed operation portion 90b on the potential of the body regions in the low-speed operation portion 90a and the middle-speed operation portion 90c.

The Twelfth Preferred Embodiment

FIG. 44 is a plan view showing a structure of a semiconductor device in accordance with the twelfth preferred embodiment of the present invention. The IC chip 90 comprises a plurality of bonding pads 92a connected to an external device (not shown), an input buffer circuit 151a connected to the bonding pads 92a through the wires 152a, an internal processing circuit 150 connected to the input buffer circuit 151 through wires 153a, an output buffer circuit 151b connected to the internal processing circuit 150 through wires 153b and a plurality of bonding pads 92b connected to the output buffer circuit 151b through wires 152b. The bonding pads 92b are connected to an external device (not shown). Further, the input buffer circuit 151a and the output buffer circuit 151b are formed in an element formation region defined by the partial-isolation insulating film 5 in the silicon layer 4.

FIG. 45 is an enlarged plan view showing a connection between the bonding pad 92a and the input buffer circuit 151a and FIG. 46 is a cross section showing a cross-sectional structure of the semiconductor device taken along the like L13 of FIG. 45. In the FIG. 45, for convenience of illustration, interlayer insulating films 155 to 157 are omitted.

Referring to FIG. 45, the input buffer circuit 151a comprises a PMOS having a pair of p$^+$ source/drain regions 27, an NMOS having a pair of n$^+$ source/drain regions 28 and a CMOS having the gate electrode 7 shared by the PMOS and the NMOS. One of the pair of the source/drain regions 27 is connected to the wire 15 and the other is connected to the wire 153a. One of the pair of the source/drain regions 28 is connected to the wire 17 and the other is connected to the wire 153a. The gate electrode 7 is connected to one end of a wire 152a1, the other end of the wire 152a1 is connected to one end of a wire 152a2, the other end of the wire 152a2 is connected to one end of a wire 152a3 and the other end of the wire 152a3 is connected to the bonding pad 92a. The wires 152a1 to 152a3 are each made of metal such as aluminum.

Referring to FIG. 46, the gate electrode 7 is formed on the isolation insulating film 5. The interlayer insulating film 155 is formed on the gate electrode 7 and the isolation insulating film 5, and the wires 152a1 and 153a are formed on the interlayer insulating film 155. The wire 152a1 is connected to the gate electrode 7 through a contact hole 154a1 which is selectively formed in the interlayer insulating film 155 and filled with a conductive plug therein. The interlayer insulating film 156 is formed on the wires 152a1 and 153a and the interlayer insulating film 155, and the wire 152a2 is formed on the interlayer insulating film 156. The wire 152a2 is connected to the wire 152a1 through a contact hole 154a2 which is selectively formed in the interlayer insulating film 156 and filled with a conductive plug therein. The interlayer insulating film 157 is formed on the wires 152a2 and the interlayer insulating film 156, and the bonding pad 92a and the wire 152a3 are formed on the interlayer insulating film 157. The wire 152a3 is connected to the wire 152a2 through a contact hole 154a3 which is selectively formed in the interlayer insulating film 157 and filled with a conductive plug therein.

Below the wires 152a1 to 152a3, a complete isolation portion 95a reaching the upper surface of insulating film 3 is formed in the isolation insulating film 5. In other words, the semiconductor device of FIG. 46 comprises a complete-isolation insulating film extending from the upper surface of the silicon layer 4 to reach the upper surface of the insulating film 3 below the wires 152a1 to 152a3 connecting the bonding pad 92a and the input buffer circuit 151a. The complete isolation portion 95a shown in FIG. 46 is formed in a complete isolation region 94a shown in FIGS. 44 and 45. Further, in the example shown in FIGS. 45 and 46, a complete-isolation insulating film is formed also below the bonding pad 92a.

Similarly, the semiconductor device of FIG. 44 comprises a complete-isolation insulating film extending from the upper surface of the silicon layer 4 to reach the upper surface of the insulating film 3 below the wire 152b connecting the output buffer circuit 151b and the bonding pad 92b. Specifically, a complete isolation portion of the isolation insulating film 5 is formed in the complete isolation region 94b shown in FIG. 44.

The input buffer circuit 151a, which is connected to the external device through the wire 152a and the bonding pad 92a, is likely to be affected by some noise inputted from the external device. In the semiconductor device of the twelfth preferred embodiment, to solve this problem a complete-isolation insulating film is formed, instead of the silicon portion of the silicon layer 4, is formed below the wire 152a connecting the bonding pad 92a and the input buffer circuit 151a. For this reason, in the semiconductor device of the twelfth preferred embodiment, even if the potential of the wire 152a varies due to some noise, no variation in potential of the silicon layer 4 below the wire 152a is caused by the above potential variation. As a result, it is possible to suppress propagation of the noise inputted from the external device to the internal processing circuit 150.

Similarly, the output buffer circuit 151b, which is connected to the external device through the wire 152b and the bonding pad 92b, is likely to be affected by some noise inputted from the external device. In the semiconductor device of the twelfth preferred embodiment, to solve this problem, a complete-isolation insulating film is formed, instead of the silicon portion of the silicon layer 4, is formed below the wire 152*b* connecting the bonding pad 92*b* and the output buffer circuit 151*b*. For this reason, in the semiconductor device of the twelfth preferred embodiment, even if the potential of the wire 152*b* varies due to some noise, no variation in potential of the silicon layer 4 below the wire 152*b* is caused by the above potential variation. As a result, it is possible to suppress propagation of the noise inputted from the external device to the internal processing circuit 150.

Further, both the complete-isolation insulating film below the wire 152*a* and the complete-isolation insulating film below the wire 152*b* do not necessarily have to be formed, but either one may be formed depending on the purpose.

Furthermore, as shown in FIG. 43, a complete-isolation insulating film surrounding the input buffer circuit 151*a* may be further formed. This can eliminate mutual effect on the variation in body potential between the input buffer circuit 151*a* and the internal processing circuit 150. Similarly, a complete-isolation insulating film surrounding the output buffer circuit 151*b* may be further formed. This can eliminate mutual effect on the variation in body potential between the output buffer circuit 151*b* and the internal processing circuit 150.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   an SOI substrate having a structure in which a semiconductor substrate, an insulating layer and a semiconductor layer are layered in this order, the semiconductor substrate being in contact with the insulating layer;
   a first isolation insulating film formed in a main surface of said semiconductor layer and said semiconductor layer existing between said first isolation insulating film and said insulating layer;
   a first semiconductor element formed in an element formation region isolated by said first isolation insulating film in said semiconductor layer;
   a second semiconductor element formed adjacently to said first semiconductor element in said semiconductor layer, having an operating frequency different from that of said first semiconductor element; and
   a second isolation insulating film formed in said semiconductor layer and reaching said insulating layer between said first semiconductor element and said second semiconductor element; and
   an interlayer insulating film formed on said first and second semiconductor elements and said first and second isolation insulating film.

2. The semiconductor device according to claim 1, further comprising:
   a signal line formed on said interlayer insulating film, being electrically connected to said first semiconductor element; wherein
   said second isolation insulating film formed extending from said main surface of said semiconductor layer, reaching an upper surface of said insulating layer below said signal line.

3. The semiconductor device according to claim 2, wherein said signal line is made of metal.

4. The semiconductor device according to claim 2, wherein said signal line is made of polysilicon.

* * * * *